(12) United States Patent
Yamauchi et al.

(10) Patent No.: US 7,821,200 B2
(45) Date of Patent: *Oct. 26, 2010

(54) EL DISPLAY DEVICE, DRIVING METHOD THEREOF, AND ELECTRONIC EQUIPMENT PROVIDED WITH THE EL DISPLAY DEVICE

(75) Inventors: Yukio Yamauchi, Shizuoka (JP); Takeshi Fukunaga, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 281 days.

This patent is subject to a terminal disclaimer.

(21) Appl. No.: 11/907,860

(22) Filed: Oct. 18, 2007

(65) Prior Publication Data

US 2008/0116458 A1 May 22, 2008

Related U.S. Application Data

(60) Continuation of application No. 10/980,600, filed on Nov. 4, 2004, now Pat. No. 7,312,572, which is a division of application No. 10/198,047, filed on Jul. 19, 2002, now Pat. No. 6,844,683, which is a division of application No. 09/599,394, filed on Jun. 21, 2000, now Pat. No. 6,452,341.

(30) Foreign Application Priority Data

Jun. 21, 1999 (JP) ................................. 11-174734

(51) Int. Cl.
*H05B 33/00* (2006.01)

(52) U.S. Cl. .................. 313/506; 313/504; 315/169.3; 345/76

(58) Field of Classification Search .................. None
See application file for complete search history.

(56) References Cited

U.S. PATENT DOCUMENTS 5,528,056 A 6/1996 Shimada et al.

(Continued)

FOREIGN PATENT DOCUMENTS

DE 198 25 081 12/1998

(Continued)

OTHER PUBLICATIONS

Search Report (Application No. 00112913.9) Dated Dec. 3, 2008.

(Continued)

*Primary Examiner*—Ashok Patel
(74) *Attorney, Agent, or Firm*—Eric J. Robinson; Robinson Intellectual Property Law Office, P.C.

(57) ABSTRACT

An EL display device capable of performing clear multi-gradation color display and electronic equipment provided with the EL display device are provided, wherein gradation display is performed according to a time-division driving method in which the luminescence and non-luminescence of an EL element (109) disposed in a pixel (104) are controlled by time, and the influence by the characteristic variability of a current controlling TFT (108) is prevented. When this method is used, a data signal side driving circuit (102) and a gate signal side driving circuit (103) are formed with TFTs that use a silicon film having a peculiar crystal structure and exhibit an extremely high operation speed.

21 Claims, 16 Drawing Sheets

U.S. PATENT DOCUMENTS

| | | |
|---|---|---|
| 5,585,695 A | 12/1996 | Kitai |
| 5,747,830 A | 5/1998 | Okita |
| 5,747,928 A * | 5/1998 | Shanks et al. ............... 313/498 |
| 5,790,213 A | 8/1998 | Sasaki et al. |
| 5,821,688 A * | 10/1998 | Shanks et al. ............... 313/498 |
| 6,084,579 A | 7/2000 | Hirano |
| 6,147,451 A | 11/2000 | Shibata et al. |
| 6,147,667 A | 11/2000 | Yamazaki et al. |
| 6,175,345 B1 * | 1/2001 | Kuribayashi et al. .......... 345/76 |
| 6,177,767 B1 | 1/2001 | Asai et al. |
| 6,204,534 B1 | 3/2001 | Adan |
| 6,274,887 B1 | 8/2001 | Yamazaki et al. |
| 6,303,963 B1 | 10/2001 | Ohtani et al. |
| 6,307,214 B1 | 10/2001 | Ohtani et al. |
| 6,365,917 B1 | 4/2002 | Yamazaki |
| 6,380,007 B1 | 4/2002 | Koyama |
| 6,380,558 B1 | 4/2002 | Yamazaki et al. |
| 6,392,628 B1 | 5/2002 | Yamazaki et al. |
| 6,469,686 B1 | 10/2002 | Koyama et al. |
| 6,512,504 B1 | 1/2003 | Yamauchi et al. |
| 6,545,359 B1 | 4/2003 | Ohtani et al. |
| 6,583,471 B1 | 6/2003 | Yamazaki et al. |
| 6,593,592 B1 | 7/2003 | Yamazaki et al. |
| 6,689,492 B1 | 2/2004 | Yamazaki et al. |
| 6,879,309 B2 | 4/2005 | Yamauchi et al. |
| 6,992,651 B1 | 1/2006 | Koyama et al. |
| 7,022,556 B1 | 4/2006 | Adachi |
| 7,126,161 B2 | 10/2006 | Yamazaki |
| 7,141,821 B1 | 11/2006 | Yamazaki et al. |
| 7,274,349 B2 | 9/2007 | Yamauchi et al. |
| 2004/0065902 A1 | 4/2004 | Yamazaki et al. |
| 2004/0238820 A1 | 12/2004 | Sakama et al. |
| 2005/0161672 A1 | 7/2005 | Yamazaki et al. |
| 2005/0197031 A1 | 9/2005 | Yamazaki et al. |
| 2006/0113597 A1 | 6/2006 | Ono et al. |
| 2006/0156082 A1 | 7/2006 | Koyama et al. |
| 2008/0018566 A1 | 1/2008 | Yamauchi et al. |

FOREIGN PATENT DOCUMENTS

| | | |
|---|---|---|
| EP | 0717445 | 6/1996 |
| EP | 0781075 | 6/1997 |
| EP | 0 921 517 | 6/1999 |
| EP | 1017108 | 7/2000 |
| JP | 62-090260 | 4/1987 |
| JP | 08-078159 | 3/1996 |
| JP | 08-241048 | 9/1996 |
| JP | 10-247735 | 9/1998 |

OTHER PUBLICATIONS

Office Action (U.S. Appl. No. 10/980,600; US4217D1D1) dated Jan. 24, 2007.

* cited by examiner

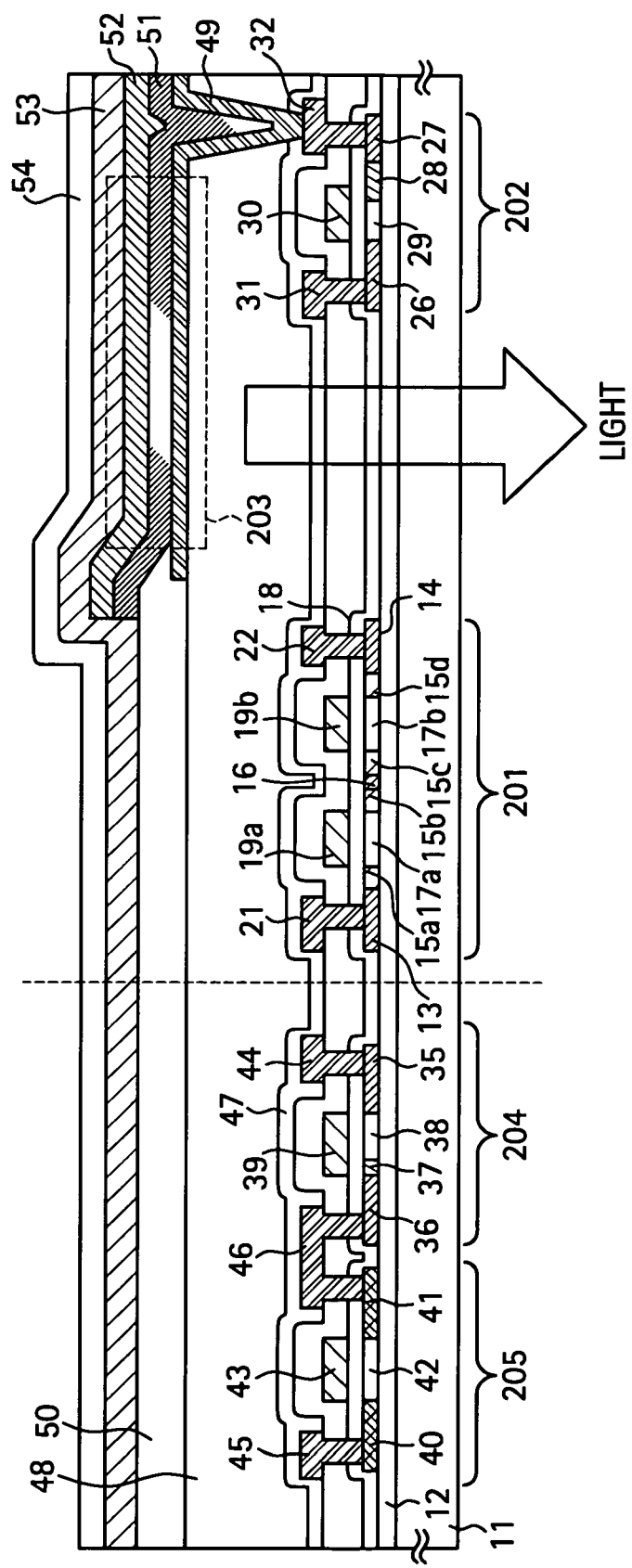

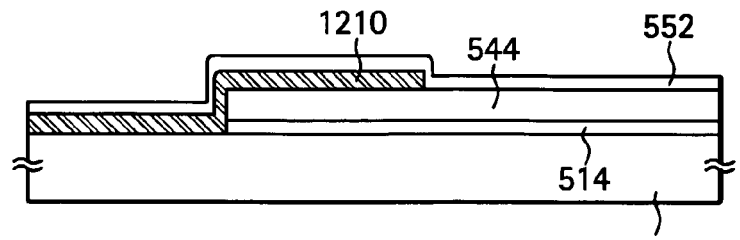
FIG. 13A
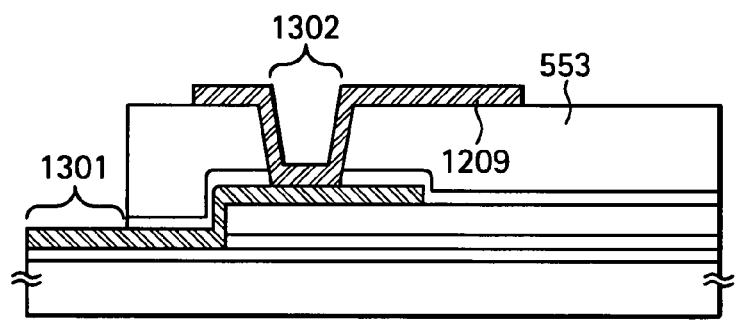
FIG. 13B
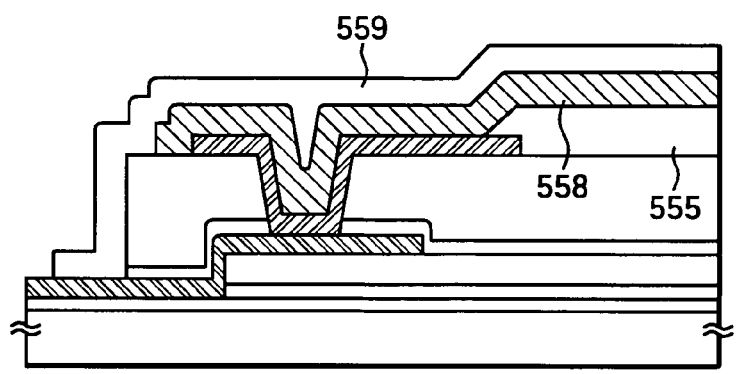
FIG. 13C
FIG. 14
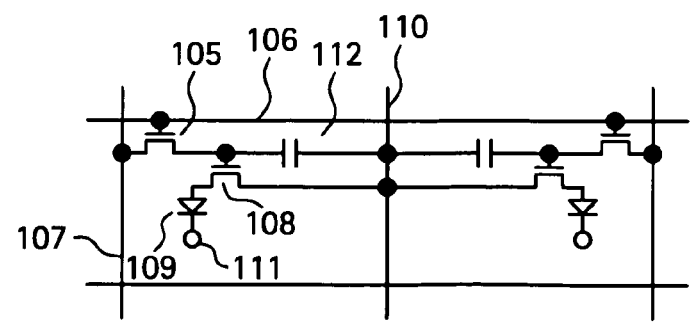

EL DISPLAY DEVICE, DRIVING METHOD THEREOF, AND ELECTRONIC EQUIPMENT PROVIDED WITH THE EL DISPLAY DEVICE

BACKGROUND OF THE INVENTION

1. Field of the Invention

This invention relates to an EL (electro-luminescence) display device formed by constructing a semiconductor device (i.e., a device made of a semiconductor thin film) on a substrate and relates to electronic equipment (electronic device) in which the EL display device is used as a display panel (display portion).

2. Description of Related Art

In recent years, great advances have been made in a technique for forming TFTs on a substrate, and development has proceeded in the application thereof to an active matrix type display. Especially, a TFT using a polysilicon film is higher in electron field-effect mobility than a conventional TFT using an amorphous silicon film, and can operate at a high speed. Therefore, it has been made possible to control a pixel by a driving circuit formed on the same substrate on which the pixel is also formed, although the pixel had been conventionally controlled by the driving circuit disposed outside the substrate.

The active matrix type display is attracting public attention because it can obtain various advantages, such as reduced manufacturing costs, reduced size of the display device, increased yields, and reduced throughput, by constructing various circuits or elements on the same substrate.

Conventionally, the pixel of the active matrix type EL display has been generally constructed as shown in FIG. 3. In FIG. 3, reference character 301 designates a TFT that functions as a switching element (hereinafter, referred to as switching TFT), 302 designates a TFT that functions as an element (current controlling element) to control a current supplied to an EL element 303 (hereinafter, referred to as current controlling TFT), and 304 designates a capacitor (capacitance storage). The switching TFT 301 is connected to a gate wiring line 305 and a source wiring line 306 (data wiring line). The drain of the current controlling TFT 302 is connected to the EL element 303, and the source thereof is connected to a current-feed line 307.

When the gate wiring line 305 is selected, the gate of the switching TFT 301 is opened, the data signal of the source wiring line 306 is then stored in the capacitor 304, and the gate of the current controlling TFT 302 is opened. After the gate of the switching TFT 301 is closed, the gate of the current controlling TFT 302 is kept opening by the charge stored in the capacitor 304. During that interval, the EL element 303 emits light. The amount of luminescence of the EL element 303 changes according to the amount of a flowing current.

At this time, the amount of current supplied to the EL element 303 is controlled by the gate voltage of the current controlling TFT 302. This is shown in FIG. 4.

FIG. 4(A) is a graph showing transistor characteristics of the current controlling TFT. Reference character 401 is called Id-Vg characteristic (or Id-Vg curve). Herein, Id is a drain current, and Vg is a gate voltage. The amount of a flowing current corresponding to an arbitrary gate voltage can be known from this graph.

Normally, the region shown by the dotted line 402 of the Id-Vg characteristic is used when the EL element is driven. An enlarged view of the enclosed region of the dotted line 402 is shown in FIG. 4(B).

In FIG. 4(B), the region shown by the oblique lines is called a sub-threshold region. In practice, it is indicated as a region in which a gate voltage is near or less than a threshold voltage (Vth). The drain current exponentially changes according to the change of the gate voltage in this region. Using this region, the current is controlled by the gate voltage.

The data signal input into a pixel by opening the switching TFT 301 is first stored in the capacitor 304, and the data signal directly acts as the gate voltage of the current controlling TFT 302. At this time, the drain current with respect to the gate voltage is determined by one-to-one according to the Id-Vg characteristic shown in FIG. 4(A). That is, a given current flows through the EL element 303 corresponding to the data signal, and the EL element 303 emits light by the amount of luminescence corresponding to the amount of the current.

The amount of luminescence of the EL element is controlled by the data signal, as mentioned above, and thereby gradation display is performed. This is a so-called analog gradation method, in which the gradation display is performed by a change in the amplitude of the signal.

However, there is a defect in that the analog gradation method is very weak in the characteristic variability of TFTs. For example, let it be assumed that the Id-Vg characteristic of a switching TFT differs from that of a switching TFT of an adjacent pixel that displays the same gradation level (i.e., a shift is performed toward a plus or a minus side overall).

In this situation, drain currents of the switching TFTs differ from each other, though depending on the level of the variability, and thus a different gate voltage will be applied to the current controlling TFT of each pixel. In other words, a different current flows through each EL element, and, as a result, a different amount of luminescence is emitted, and the display of the same gradation level cannot be achieved.

Additionally, even if an equal gate voltage is applied to the current controlling TFT of each pixel, the same drain current cannot be output if the Id-Vg characteristic of the current controlling TFTs has variability. Additionally, as is clear from FIG. 4(A), a region is used in which the drain current exponentially changes according to a change in the gate voltage, and, therefore, a situation will occur in which, if the Id-Vg characteristic shifts most slightly, the amount of current to be output becomes greatly different even if an equal gate voltage is applied thereto. If so, adjacent pixels will have a great difference in the amount of luminescence of the EL element.

In practice, each individual variability of the switching TFT and the current controlling TFT acts synergistically, and a stricter condition will be imposed. The analog gradation method is extremely sensitive to the characteristic variability of the TFTs, as mentioned above, and this has caused an obstruction to realizing the multicolor of the conventional active matrix type EL display device.

SUMMARY OF THE INVENTION

The present invention was made in consideration of the above problem, and it is an object of the present invention to provide an active matrix type EL display device capable of performing clear multi-gradation color display. It is another object of the present invention to provide high-performance electronic equipment provided a with such an active matrix type EL display device.

The present applicant thought that a digital gradation method in which the current controlling TFT is used only as a switching element for supplying a current is better than the conventional analog gradation method in which the amount of luminescence of the EL element is controlled by controlling a current, in order to design a pixel structure to be unsusceptible to the influence of the characteristic variability of the TFT.

From this, the present applicant thought that the most desirable gradation display method in the active matrix type EL display device is a divided gradation display method, more specifically, a gradation display method under a time-division method (hereinafter, designated as time-division gradation or time-division gradation display).

In practice, the time-division gradation display is performed as follows. A description is herein given of a case in which the full color display of 256-gradation (16,770,000 colors) is performed according to an 8-bit digital driving method.

First of all, one frame of an image is divided into eight sub-frames. Herein, one cycle when data is input to all pixels of a displayed area is called one frame. Oscillation frequency in a normal EL display device is 60 Hz, in other words, 60 frames are formed per second. Flickering of the image, for example, begins to be visually conspicuous when the number of frames per second falls below this. A divided frame obtained by dividing one frame into a plurality of frames is called a sub-frame.

One sub-frame is divided into an address period (Ta) and a sustained period (Ts). The address period is the entire time required to input data to all pixels during one sub-frame, and the sustained period (or lighting period) is a period during which the EL element emits light. (FIG. 10)

Herein, the first sub-frame is called SF1, and the remaining sub-frames from the second to the eighth sub-frame are called SF2-SF8, respectively. The address period (Ta) is constant in SF1-SF8. On the other hand, the sustained periods (Ts) corresponding to SF1-SF8 are called Ts1-Ts8, respectively.

At this time, the sustained periods are arranged to be Ts1:Ts2:Ts3:Ts4:Ts5:Ts6:Ts7:Ts8=1:½:¼:⅛:1/16:1/32:1/64:1/128. However, the order in which SF1-SF8 are caused to appear does not matter. Desired gradation display among 256 gradations can be performed by combining the sustained periods.

First of all, in a state in which a voltage is not applied (or not selected) to an opposite electrode of an EL element of a pixel (note that the opposite electrode is an electrode not connected to a TFT; normally, this is a cathode), a data signal is input to each pixel without light emission of the EL element. This period is defined as an address period. When the data is input to all the pixels and the address period is completed, a voltage is applied (or selected) to the opposite electrode, thus allowing the EL element to emit light. This period is defined as a sustained period. The period during which light is emitted (i.e., the pixel is lit) is any one of Ts1-Ts8. Let it be herein supposed that a predetermined pixel is lit during Ts8.

Thereafter, taking again an address period, a data signal is input to all pixels, and then a sustained period is entered. At this time, the sustained period is any one of Ts1-Ts7. Let it be herein supposed that a predetermined pixel is lit during Ts7.

Thereafter, the same operation is repeated for the remaining six sub-frames, and, by setting the sequential sustained periods in the order of Ts6, Ts5, . . . and Ts1, a predetermined pixel is lit in each sub-frame.

When eight sub-frames appear, one frame is finished. At this time, the gradation of the pixel is controlled by multiplying the sustained periods. For example, when Ts1 and Ts2 are selected, a brightness of 75% can be expressed on the supposition that all the light is 100%, and, when Ts3, Ts5, and Ts8 are selected, a brightness of 16% can be expressed.

256-gradation display was described above, but other gradation display can be performed.

When the gradation display ($2^n$-gradation display) of n bit (n is an integer of two or more) is performed, one frame is first divided into n sub-frames (SF1, SF2, SF3, . . . SF(n−1), and SF(n)), while corresponding to the gradation of n bit. The number of divisions of one frame increases as the gradation increases, and a driving circuit must be operated at a high frequency.

The n sub-frames are each divided into address periods (Ta) and sustained periods (Ts). In other words, the address and sustained periods are selected by selecting whether to apply a voltage to an opposite electrode common to all EL elements or not.

And, the sustained period corresponding to each of the n sub-frames is processed to be Ts1:Ts2:Ts3: . . . :Ts(n−1):Ts(n)=$2^0$:$2^{-1}$:$2^{-2}$: . . . :$2^{-(n-2)}$:$2^{-(n-1)}$ (herein, the sustained period corresponding to SF1, SF2, SF3, . . . , SF(n−1), and SF(n) is Ts1, Ts2, Ts3, . . . , Ts(n−1), and Ts(n), respectively).

In this state, a pixel is sequentially selected in one arbitrary frame (more strictly, the switching TFT of each pixel is selected), and a predetermined gate voltage (corresponding to a data signal) is applied to the gate electrode of the current controlling TFT. At this time, the EL element of a pixel to which the data signal actuating the current controlling TFT is input emits light only during the sustained period allocated to the sub-frame after completion of the address period. That is, a predetermined pixel emits light.

This operation is repeated in all the n sub-frames, and the gradation of each pixel is controlled by multiplying the sustained periods. Accordingly, when paying attention to an arbitrary pixel, the gradation of the pixel is controlled according to how long the pixel is lit in each sub-frame (i.e., how long the sustained period has lasted).

As mentioned above, it is the most noticeable feature of the present invention that time-division gradation display is used for the active matrix type EL display device. In order to perform this time-division gradation, one frame must be divided into a plurality of sub-frames. In other words, it is more necessary than before to improve the operating frequency of the driving circuits on the data signal side and on the gate signal side.

However, it is difficult to make a TFT capable of operating at such a high speed from the conventional polysilicon film (also called a polycrystal silicon film). The operation frequency can be decreased by dividing the driving circuit on the data signal side into a plurality of circuits, but a satisfactory result cannot be accomplished if so.

Therefore, in the present invention, use is made of a silicon film having a peculiar crystal structure in which the continuity of a grain boundary is high and the crystal orientation is unidirectional. This film is used as an active layer of a TFT, thereby allowing the TFT to exhibit very high operation and speed. That is, it is one of the features of the present invention to also perform the time-division gradation display of the active matrix type EL display device by the use of such a high operating speed TFT. A description is hereinafter given of observed results of a silicon film used in the present invention that was made experimentally.

The silicon film used in the present invention has a crystal structure in which, microscopically, a plurality of needle-shaped crystals or bar-shaped crystals (hereinafter, designated as bar crystal) gather and form lines. This can be easily confirmed from observations according to the TEM (transmission electron microscope).

Additionally, as a result of carrying out detailed observations of an electron beam diffraction image of a spot diameter of about 1.35 μm concerning the silicon film used in the present invention, diffraction spots corresponding to a {110} plane appear regularly in spite of the existence of a slight fluctuation, and it can be confirmed to have the {1 1 0} plane as a main orientation plane though a crystallographic axis has a slight deviation.

FIG. 19(A) shows an electron beam diffraction image obtained by projecting an electron beam of a spot diameter of about 1.35 µm onto the silicon film used in the present invention. On the other hand, FIG. 19(B) shows an electron beam diffraction image obtained by projecting an electron beam onto the conventional polysilicon film under the same conditions. In each figure, the center of the photograph is a position (projected point of the electron beam) onto which the electron beam was projected.

While the diffraction spots corresponding to the {1 1 0} plane appear comparatively regularly in FIG. 19(A), they are arranged to be quite irregular in FIG. 19(B), and thus the orientation planes are obviously nonuniform. From this electron beam diffraction photograph, the silicon film used in the present invention can be immediately distinguished from the conventional polysilicon film.

In the electron beam diffraction image of FIG. 19(A), it is obvious, by comparison with the electron beam diffraction image of a monocrystal silicon wafer of the {1 1 0} orientation, that the diffraction spot corresponding to the {1 1 0} plane appears. Additionally, while the diffraction spot of the monocrystal silicon wafer is seen as a sharp spot, the diffraction spot of the silicon film used in the present invention has an expanse on the concentric circle centering the projected point of the electron beam.

This is also a feature of the silicon film used in the present invention. Since the {1 1 0} plane is an individual orientation plane for each crystal grain, it is expected that the same diffraction spot as the monocrystal silicon is obtained as far as one crystal grain is concerned. However, in practice, they exist as a collective of a plurality of crystal grains, and therefore each grain has a slight rotation around the crystallographic axis, and a plurality of diffraction points, each corresponding to the crystal grain appear on the concentric circle, though each crystal grain sets the {1 1 0} plane as its own orientation plane. The points are laid upon each other so as to exhibit an expanse.

However, since an each individual crystal grain forms a grain boundary quite excellent in consistency, as described later, the slight rotation around the crystallographic axis does not constitute a factor for ruining crystallinity. Therefore, it can be said that the electron beam diffraction image of the silicon film used in the present invention substantially has no distinction to the electron beam diffraction image of the monocrystal silicon wafer of the {1 1 0} orientation.

From the foregoing, it may safely be affirmed that the silicon film used as an active layer of a TFT in the present invention is the silicon film showing the electron beam diffraction image corresponding to the {1 1 0} orientation.

Now, a description will be given of the grain boundary of the silicon film used in the present invention. Although a description is given under the designation of "grain boundary" for convenience of explanation, this can be regarded as an interface between a certain crystal grain and another crystal grain that has derived (or branched) therefrom. Anyway, the designation of "grain boundary" including the meaning of the aforementioned interface is used in this specification.

The present applicant confirmed that, from observation of a grain boundary formed by the contact of individual bar crystals under the HR-TEM (high-resolution transmission electron microscope), there is continuity in the crystal lattice in the grain boundary. This can be easily confirmed from the fact that lattice fringes under observation are continuously linked to each other in the grain boundary.

The continuity of the crystal lattice in the grain boundary originates from the fact that it is a grain boundary called "planar boundary". The definition of the planar boundary in this specification derives from "Planar Boundary" appearing in "Characterization of High-Efficiency Cast-Si Solar Cell Wafers by MBIC Measurement; Ryuichi Shimokawa and Yutaka Hayashi, Japanese Journal of Applied Physics vol. 27, No. 5, pp. 751-758, 1988."

According to the above article, the planar boundary includes a twin grain boundary, a special lamination fault, and a special twist grain boundary. This planar boundary has a feature in that it is electrically inert. That is, although it is a grain boundary since the planar boundary does not function as a trap to obstruct the movement of a carrier, it can in fact be considered as no existence.

Especially, when the crystallographic axis (axis perpendicular to the crystal plane) is the <110> axis, the {211} twin grain boundary and the {111} twin grain boundary are often called a corresponding grain boundary of Σ3. A Σ value is a parameter serving as an indicator that shows the level of the consistency of the corresponding grain boundary, and it is known that the grain boundary increases in excellence in consistency as the Σ value falls.

As a result of observing the silicon film used in the present invention by the TEM, almost all the grain boundaries have proved to be corresponding grain boundaries of Σ3. This was judged from the fact that a grain boundary formed between two crystal grains becomes the corresponding grain boundary of Σ3 when θ=70.5° wherein θ is an angle formed by the lattice fringes corresponding to the {111} plane when the plane orientation of both crystal grains is {1 1 0}.

It is noted that it becomes the corresponding grain boundary of Σ9 when θ=38.9°, and other grain boundaries, such as this grain boundary, also exist.

The crystal structure (more accurately, structure of the grain boundary) shows that two crystal grains different in the grain boundary are connected to each other with quite excellently consistency. In other words, a structure is established in which crystal lattices range continuously in the grain boundary, and it is very difficult to create a trap level resulting from, for example, a crystal fault. Therefore, a semiconductor thin film that has a crystal structure such as the above one can in fact be considered to have no grain boundary.

It is confirmed by TEM observation that faults (stacking fault etc.) existing in the crystal grain disappear almost completely by conducting a heating process at 700-1150° C. in sequential steps when the silicon film used in the present invention is formed. This is apparent from the fact that the number of faults is greatly decreased before and after the heating process.

The difference in the number of faults appears as the difference in the spin density according to electron spin resonance analysis (ESR analysis). In the current state, the spin density of the silicon film used in the present invention has proved to be at least $5 \times 10^{17}$ spins/cm$^3$ or less (preferably, $3 \times 10^{17}$ spins/cm$^3$ or less). However, since this measurement value is close to the detection limit of measuring devices in existence, it is expected that an actual spin density is even lower.

A further detailed description of the silicon film used in the present invention can be supplied by Patent Application Nos. 044659 of 1998, 152316 of 1998, 152308 of 1998, and 152305 of 1998, each filed by the present applicant.

A TFT in which the silicon film used in the present invention is experimentally made an active layer shows an electrical characteristic that equals MOSFET. The following data are obtained from the TFT (in which the film thickness of the active layer is 30 nm, and that of the gate insulating film is 100 nm) experimentally made by the present applicant.

(1) The sub-threshold coefficient which is the index of switching performance (quickness of on/off operation switch) is 60~100 mV/decade (representatively, 60~85 mV/decade) in both N-channel type TFT and P-channel type TFT: this value is small.

(2) The electron field-effect mobility ($\mu_{FE}$) which is the index of the operation speed of the TFT is 200~650 cm$^2$/Vs (300~500 cm$^2$/Vs representatively) in N-channel type TFT, and is 100~300 cm$^2$/Vs (150~200 cm$^2$/Vs representatively) in P-channel type TFT: these values are large.

(3) The threshold voltage ($V_{th}$) which is the index of the driving voltage of the TFT is –0.5~1.5 in N-channel type TFT, and is –1.5~0.5 in P-channel type TFT: these values are small.

It is confirmed to be capable of realizing quite excellent switching characteristics and high-speed operation properties, as described above. In addition, in a ring oscillator experimentally made by the use of the TFT, the oscillation frequency of about 1 GHz is obtained at the maximum. The ring oscillator is constructed as follows.

Number of steps: nine steps;
Film thickness of the gate insulating film of the TFT: 30 nm and 50 nm;
Gate length of the TFT (channel-length): 0.6 μm.

Additionally, as a result of actually making a shift register experimentally and confirming the operation frequency, the output pulse of the operation frequency of 100 MHz is obtained in the shift register in which the film thickness of the gate insulating film is 30 nm, the gate length is 0.6 μm, the power supply voltage is 5V, and the number of steps is 50.

The marvelous data of the ring oscillator and the shift register mentioned above indicate that the TFT in which the silicon film used in the present invention is made an active layer equals MOSFET, which uses a monocrystal silicon, or has operational performance surpassing MOSFET.

BRIEF DESCRIPTION OF THE DRAWINGS

FIG. 2 shows a sectional structure of the EL display device.
FIGS. 13A-13C show manufacturing steps of a contact structure.
FIG. 14 shows a structure of the pixel portion of the EL display device.

DETAILED DESCRIPTION OF THE PREFERRED EMBODIMENTS

Figure 1A:
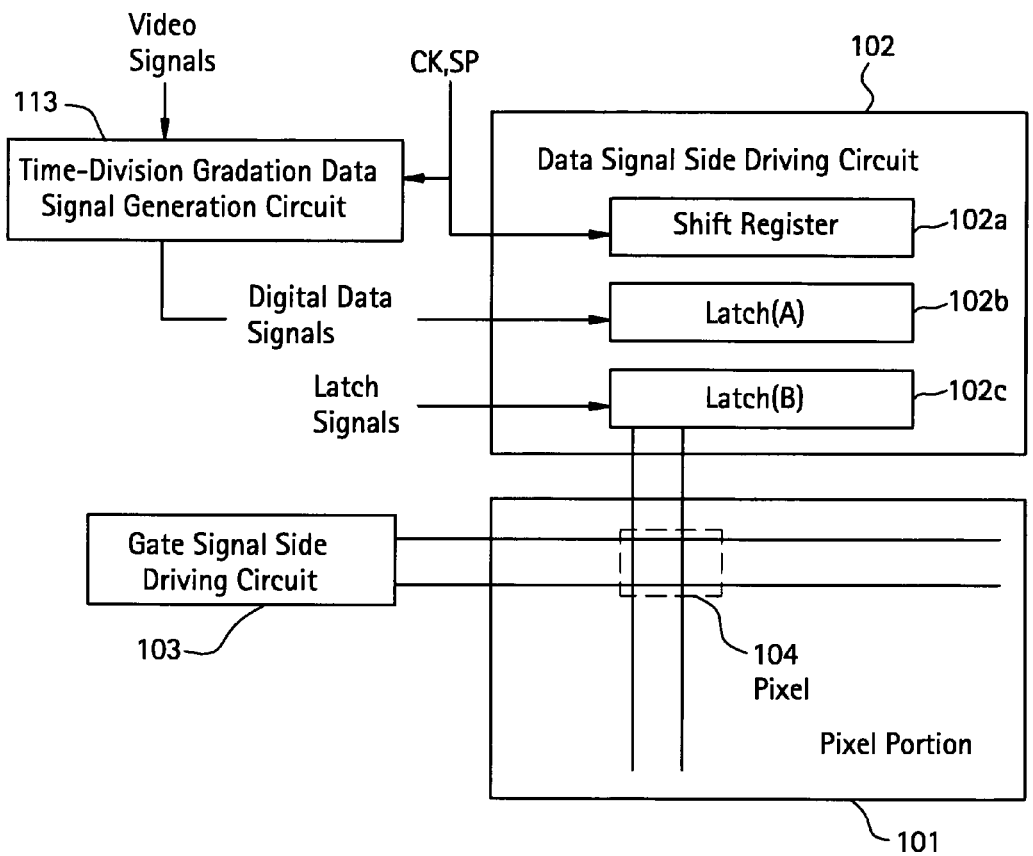
FIGS. 1A and 1B show structures of an EL display device.

First, the circuit structure of the active matrix type EL display device of the present invention is shown in FIG. 1(A). In the active matrix type EL display device of FIG. 1(A), a pixel portion 101, a data signal side driving circuit 102, and a gate signal side driving circuit 103 disposed around the pixel portion are formed by TFTs formed on a substrate. Instead, the data side signal side driving circuit and the gate signal side driving circuit may be disposed, with the pixel portion therebetween, in the form of a pair of circuits.

The data signal side driving circuit 102 basically includes a shift register 102*a*, a latch (A) 102*b*, and a latch (B) 102*c*. Clock pulses (CK) and start pulses (SP) are input to the shift register 102*a*, digital data signals are input to the latch (A) 102*b*, and latch signals are input to the latch (B) 102*c*.

In the present invention, the data signal input to the pixel portion 101 is a digital signal, and voltage gradation display is not performed although it is done in a liquid crystal display device. Thus, the digital data signal that has information of 0" or "1" is input to the pixel portion 101 directly.

Figure 1B:
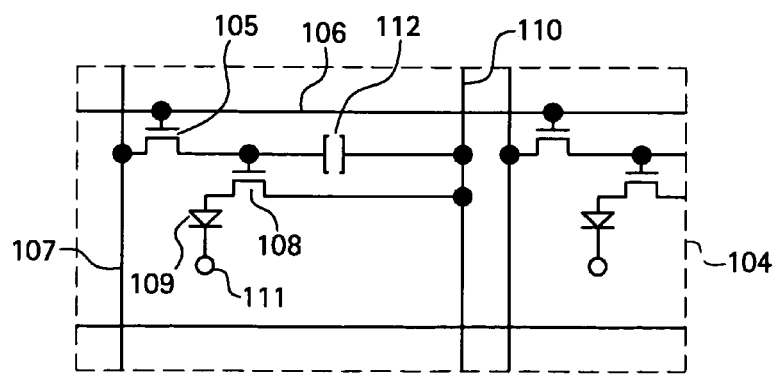
Figure 3:
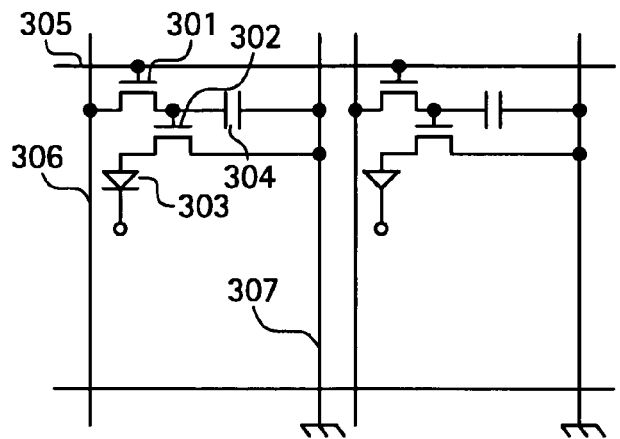
FIG. 3 shows a structure of a pixel portion of a conventional EL display device.
Figure 4A:
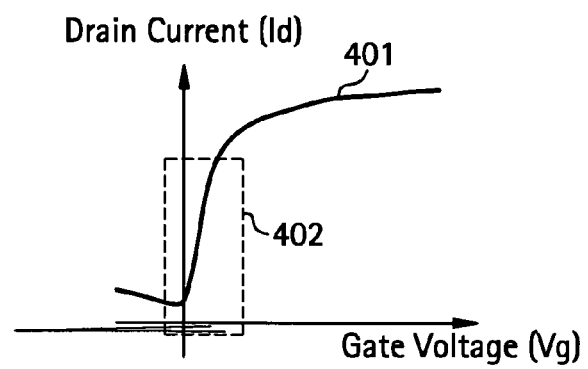
FIGS. 4A and 4B are views explaining TFT characteristics used in an analog gradation method.
Figure 4B:
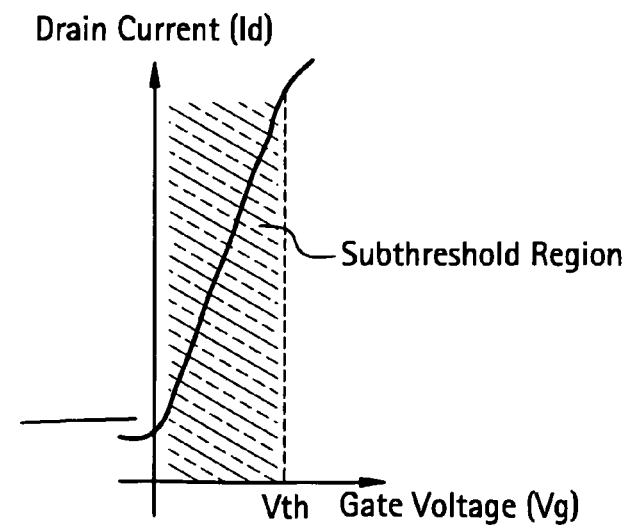

A plurality of pixels 104 are arranged in the pixel portion 101 like a matrix. An enlarged view of a pixel 104 is shown in FIG. 1(B). In FIG. 1(B), reference numeral 105 is a switching TFT. This is connected to a gate wiring line 106 for inputting gate signals, and a data wiring line 107 (also called a source wiring line) for inputting data signals.

Reference numeral 108 is a current controlling TFT. The gate thereof is connected to the drain of the switching TFT 105. The drain of the current controlling TFT 108 is connected to an EL element 109, and the source thereof is connected to a current-feed line 110. The EL element 109 is made up of an anode (pixel electrode) connected to the current controlling TFT 108 and a cathode (opposite electrode) facing the anode, with an EL layer between the anode and the cathode. The cathode is connected to a given power line 111.

When the switching TFT 105 is in a non-selective state (off state), a capacitor 112 is provided to maintain a gate voltage of the current controlling TFT 108. The capacitor 112 is connected to the drain of the switching TFT 105 and to the current-feed line 110.

The digital data signal input to the pixel portion as mentioned above is generated by a time-division gradation data signal generation circuit 113. The circuit 113 is to convert a video signal (including image information) that is comprised of analog signals or digital signals into a digital data signal for performing time-division gradation and, in addition, to generate timing pulses, etc., required to performing time-division gradation display.

Typically, the time-division gradation data signal generation circuit 113 includes a means for dividing one frame into n sub-frames corresponding to the gradation of n bit (n is an integer of two or more), a means for selecting an address period and a sustained period in the n sub-frames, and a means for setting the sustained period to be Ts1:Ts2:Ts3: ... :Ts(n−1):Ts(n)=$2^0:2^{-1}:2^{-2}: \ldots :2^{-(n-2)}:2^{-(n-1)}$.

The time-division gradation data signal generation circuit 113 can be disposed outside the EL display device of the present invention. If so, digital data signals generated at that place are input to the EL display device of the present invention. In this case, electronic equipment that has the EL display device of the present invention as a display panel will include the EL display device and the time-division gradation data signal generation circuit of the present invention as different constituents.

Additionally, the time-division gradation data signal generation circuit 113 can be mounted on the EL display device of the present invention in the form of, for example, an IC chip. If so, digital data signals generated in the IC chip are input to the EL display device of the present invention. In this case, electronic equipment that has the EL display device of the present invention as a display panel will include the EL display device of the present invention on which the IC chip including the time-division gradation data signal generation circuit is mounted as a constituent.

Finally, the time-division gradation data signal generation circuit 113 can be constructed by TFTs disposed on the same substrate as the pixel portion 104, the data signal side driving circuit 102, and the gate signal side driving circuit. If so, all can be processed on the substrate when video signals including image information are input to the EL display device. In this case, it is preferable to construct the time-division gradation data signal generation circuit by TFTs in which, as mentioned above, the silicon film used in the present invention is made into an active layer, of course. Additionally, in this case, electronic equipment that has the EL display device of the present invention as a display panel is constructed such that the time-division gradation data signal generation circuit is built in the EL display device itself. Thus, the electronic equipment can be made more compact.

Next, reference is made to FIG. 2 schematically showing the sectional structure of the active matrix type EL display device of the present invention.

In FIG. 2, reference numeral 11 is a substrate, and 12 is an insulating film that is a base (hereinafter, this film is designated as base film). For the substrate 11, use can be made of a light transmissible substrate, representatively, a glass substrate, a quartz substrate, a glass ceramic substrate, or a crystallization glass substrate. However, it must be resistible to the highest processing temperature in a manufacturing process.

The base film 12 is effective especially in using a substrate that has a movable ion or a substrate that has conductivity, but it is not necessarily disposed on the quartz substrate. An insulating film that contains silicon can be used as the base film 12. It should be noted that, in this specification, "insulating film that contains silicon" signifies an insulating film in which oxygen or nitrogen is added to silicon at a predetermined ratio (SiOxNy: x and y are arbitrary integers), such as a silicon oxide film, a silicon nitride film or a silicon nitride oxide film.

Reference numeral 201 is a switching TFT, and 202 is a current controlling TFT. Both of them are formed by an n-channel type TFT. Since the electron field-effect mobility of the n-channel type TFT is larger than that of the p-channel type TFT, the n-channel type TFT can work at a higher operation speed and allow a heavy-current to flow easily. Concerning the size of the TFT required when the same amount of current is passed, the n-channel type TFT is smaller. Therefore, it is desirable to use the n-channel type TFT as the current controlling TFT because the effective luminescence area of an image display panel is widened.

However, in the present invention, there is no need to limit the switching TFT and the current controlling TFT to the n-channel type TFT. It is also possible to use the p-channel type TFT for both of them or any one thereof.

The switching TFT 201 is made up of an active layer that includes a source region 13, a drain region 14, LDD regions 15a-15d, an isolation region 16, and channel formation regions 17a, 17b, a gate insulating film 18, gate electrodes 19a, 19b, a 1st interlayer insulating film 20, a source wiring line 21, and a drain wiring line 22. The gate insulating film 18 or the 1st interlayer insulating film 20 can be common to all TFTs on the substrate, or can be varied according to circuits or elements.

In the switching TFT 201 shown in FIG. 2, the gate electrodes 19a, 19b are connected electrically, in other words, a so-called double gate structure is established. Not only the double gate structure but also a so-called multi gate structure, such as a triple gate structure, can be established, of course. The multi gate structure signifies a structure including an active layer that has two channel formation regions or more connected in series.

The multi gate structure is very effective to decrease an OFF-state current, and if the OFF-state current of the switching TFT is decreased sufficiently, the capacity necessary for the capacitor 112 shown in FIG. 1(B) can be reduced. That is, since the possession area of the capacitor 112 can be reduced, the multi gate structure is also effective to widen the effective luminescence area of the EL element 109.

In the switching TFT 201, the LDD regions 15a-15d are disposed not to overlap with the gate electrodes 19a and 19b, with the gate insulating film 18 therebetween. The thus built structure is very effective to decrease the OFF-state current The length (width) of the LDD regions 15a-15d is 0.5-3.5 μm, representatively, 2.0-2.5 μm.

It is more desirable to form an offset region (i.e., region formed with a semiconductor layer whose composition is the same as the channel formation region, and in which a gate voltage is not applied) between the channel formation region and the LDD region, in order to decrease the OFF-state current. In the multi gate structure that has two gate electrodes or more, the isolation region 16 (i.e., region whose concentration is the same and to which the same impurity element is added as the source region or the drain region) formed between the channel formation regions is effective to decrease the OFF-state current.

The current controlling TFT 202 is made up of an active layer that includes a source region 26, a drain region 27, an LDD region 28, and a channel formation region 29, a gate insulating film 18, a gate electrode 30, the 1st interlayer insulating film 20, a source wiring line 31, and a drain wiring line 32. The gate electrode 30 can be a multi gate structure instead of the single gate structure.

The drain of the switching TFT is connected to the gate of the current controlling TFT, as shown in FIG. 1(B). In more detail, the gate electrode 30 of the current controlling TFT 202 is connected electrically to the drain region 14 of the switching TFT 201 through the drain wiring line 22 (also called connection wiring line). The source wiring line 31 is connected to the current-feed line 110 of FIG. 1(B).

The current controlling TFT 202 is an element to control the amount of current supplied to the EL element, and a comparatively large amount of current can flow therethrough. Therefore, preferably, the channel-width (W) is designed to be greater than the channel-width of the switching TFT. Additionally, preferably, the channel-length (L) is designed to be long so that an excessive current does not flow through the current controlling TFT 202. A desirable value is 0.5-2 µA (1-1.5 µA preferably) per pixel.

Figure 9:
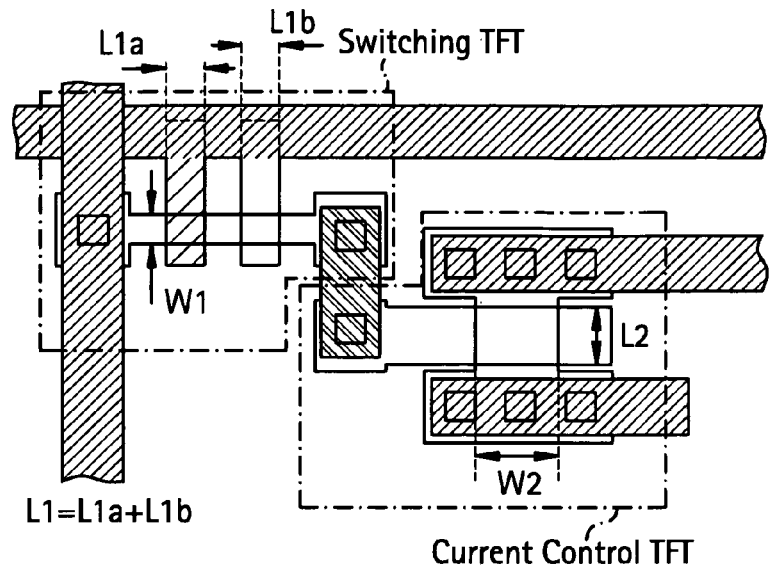
FIG. 9 is an enlarged view of the pixel portion of the EL display device.
Figure 10:
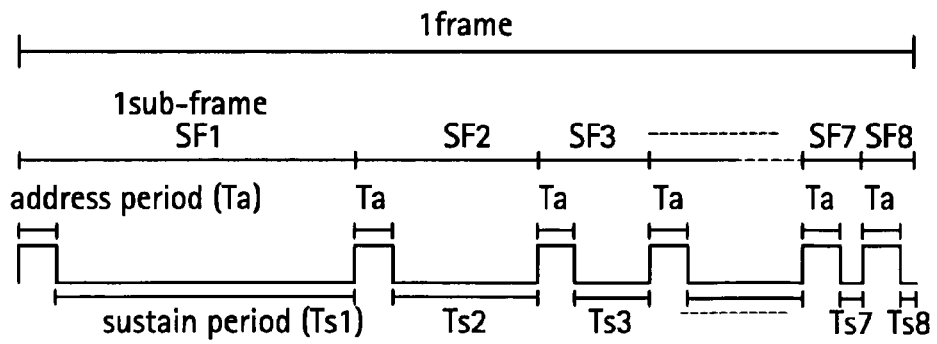
FIG. 10 is a view explaining the operation mode of a time-division gradation method.

From the foregoing, preferably, W1 is 0.1-5 µm (1-3 µm representatively), W2 is 0.5-30 µm (2-10 µm representatively), L1 is 0.2-18 µm (2-15 µm representatively), and L2 is 0.1-50 µm (1-20 µm representatively), wherein L1 is the channel-length of the switching TFT (L1=L1a+L1b), W1 is the channel-width thereof, L2 is the channel-length of the current controlling TFT, and W2 is the channel-width thereof, as shown in FIG. 9.

The EL display device shown in FIG. 2 also has a feature in that, in the current controlling TFT 202, the LDD region 28 is formed between the drain region 27 and the channel formation region 29, and, in addition, the LDD region 28 has a region overlapping with the gate electrode 30 and a region not overlapping therewith, with the gate insulating film 18 between the LDD region 28 and the gate electrode 30.

The current controlling TFT 202 passes a relatively large amount of current so that the EL element 203 emits light, and it is desirable to devise a countermeasure for deterioration caused by injection of a hot carrier. The current controlling TFT 202 is kept in an off state when a black color is displayed. In that situation, a attractive black color cannot be displayed if the OFF-state current is high, and a fall in contrast, for example, is brought about. Therefore, it is necessary to suppress the OFF-state current also.

Concerning the deterioration by the injection of the hot carrier, it is known that the structure in which the LDD region overlaps with the gate electrode is very effective. However, since the OFF-state current increases if the whole of the LDD region is caused to coincide therewith, the present applicant has solved the problem of countermeasures against both the hot carrier and the OFF-state current at the same time by providing a new structure in which the LDD region that is not coincident with the gate electrode is disposed in series, in addition to the aforementioned structure.

At this time, the length of the LDD region that overlaps with the gate electrode is designed to be 0.1-3 µm (0.3-1.5 µm preferably). The parasitic capacitance will be enlarged if it is too long, and the effect to prevent the hot carrier will be weakened if it is too short. The length of the LDD region that does not overlap with the gate electrode is designed to be 1.0-3.5 µm (1.5-2.0 µm preferably). A sufficient current cannot be passed if it is too long, and the effect to decrease the OFF-state current will be weakened if it is too short.

Since the parasitic capacitance is formed in the region where the gate electrode and the LDD region overlap with each other in the above structure, it is desirable to not dispose it between the source region 26 and the channel formation region 29. All that is required is to dispose the LDD region only on the drain region side because the flowing direction of the carrier (herein, electrons) in the current controlling TFT is always the same.

From the viewpoint of increasing the amount of current to be passed, it is also effective to thicken the film thickness of the active layer (specifically, the channel formation region) of the current controlling TFT 202 (50-100 nm preferably, and 60-80 nm further preferably). On the other hand, from the viewpoint of decreasing the OFF-state current in the switching TFT 201, it is also effective to thin the film thickness of the active layer (specifically, the channel formation region)(20-50 nm preferably, and 25-40 nm further preferably).

The structure of the TFT formed in the pixel was described above. In this formation, a driving circuit is also formed at the same time. A CMOS circuit that is a base unit to form the driving circuit is shown in FIG. 2.

In FIG. 2, a TFT that has a structure to decrease the hot carrier injection without reducing the operation speed to the utmost is used as the n-channel type TFT 204 of the CMOS circuit. The driving circuit described herein is the data signal side driving circuit 102 and the gate signal side driving circuit 103, each shown in FIG. 1. It is also possible to form other logic circuits (level shifter, A/D converter, signal division circuit, etc.), of course.

The active layer of the n-channel type TFT 204 includes a source region 35, a drain region 36, an LDD region 37, and a channel formation region 38. The LDD region 37 overlaps with the gate electrode 39, with the gate insulating film 18 therebetween.

The reason for forming the LDD region only on the drain region side is not to reduce the operation speed. There is no need to worry about the OFF-state current value in the n-channel type TFT 204. Instead, the operation speed should be rated above it. Therefore, preferably, the LDD region 37 is completely laid on the gate electrode, thus reducing a resistance component as much as possible. That is, a so-called offset should be omitted.

In the p-channel type TFT 205 of the CMOS circuit, there is no need to provide the LDD region especially because the deterioration caused by the hot carrier injection is quite negligible. Therefore, the active layer includes a source region 40, a drain region 41, and a channel formation region 42. The gate insulating film 18 and the gate electrode 43 are disposed thereon. It is also possible to dispose the LDD region as well as the n-channel type TFT 204 in order to take countermeasures against the hot carrier, of course.

When a p-channel type TFT is used as the current controlling TFT 202, it can have the same structure as the p-channel type TFT 205.

The n-channel type TFT 204 and the p-channel type TFT 205 are covered with the first interlayer insulating film 20, and the source wiring lines 44, 45 are formed. The two are connected electrically by the drain wiring line 46.

Reference numeral 47 is a first passivation film. The film thickness thereof is 10 nm-1 µm (200-500 nm preferably). An insulating film including silicon (especially, a silicon nitride oxide film or a silicon nitride film is desirable) can be used as its material. The passivation film 47 serves to protect a formed TFT from alkali metal and water. The EL layer finally disposed above the TFT includes alkali metal such as sodium. In other words, the first passivation film 47 serves also as a protective layer by which the alkali metal (movable ions) is not allowed to enter the TFT side.

Reference numeral 48 is a second interlayer insulating film, and serves as a flattening film to flatten level differences formed by the TFT. Preferably, an organic resin film, such as polyimide, polyamide, acrylic resin, or BCB (benzocyclobutene) is used as the second interlayer insulating film 48. These films have an advantage in that a good smooth plane can be easily formed, and the dielectric constant is low. It is preferable to entirely absorb the level difference caused by the TFT by means of the second interlayer insulating film because the EL layer is very sensitive to ruggedness. Additionally, it is preferable to form a low-dielectric constant material thick, in order to decrease the parasitic capacitance formed between the gate wiring line or the data wiring line and the cathode of the EL element. Therefore, preferably, the film thickness thereof is 0.5-5 µm (1.5-2.5 µm preferably).

Reference numeral 49 is a pixel electrode (anode of the EL element) that is made of a transparent conductive film. After a contact hole (opening) is made in the second interlayer insulating film 48 and the first passivation film 47, the electrode is connected to the drain wiring line 32 of the current controlling TFT 202 through the opening. When the pixel electrode 49 and the drain region 27 are arranged not to be connected directly, as in FIG. 2, the alkali metal of the EL layer can be prevented from entering the active layer via the pixel electrode.

A third interlayer insulating film 50 whose thickness is 0.3-1 μm is disposed on the pixel electrode 49. The film 50 is made of a silicon oxide film, a silicon nitride oxide film, or an organic resin film. The third interlayer insulating film 50 is provided with an opening on the pixel electrode 49 by etching, and the edge of the opening is etched to have a taper shape. Preferably, the angle of the taper is 10-60° (30-50° preferably).

An EL layer 51 is formed on the third interlayer insulating film 50. The EL layer 51 is used in the form of a single-layer structure or a layered structure. The layered structure is superior in luminous efficiency. Generally, a positive hole injection layer/a positive hole transporting layer/a luminescent layer/an electronic transporting layer are formed on the pixel electrode in this order. Instead, a structure may be used which has the order of positive hole transporting layer/luminescent layer/electronic transporting layer or the order of positive hole injection layer/positive hole transporting layer/luminescent layer/electronic transporting layer/electronic injection layer. In the present invention, any one of the known structures can be used, and fluorescent coloring matter, etc., can be doped to the EL layer.

For example, materials indicated in the following U.S. patents or publications can be used as the organic EL material; U.S. Pat. Nos. 4,356,429: 4,539,507: 4,720,432: 4,769,292: 4,885,211: 4,950,950: 5,059,861: 5,047,687: 5,073,446: 5,059,862: 5,061,617: 5,151,629: 5,294,869: 5,294,870, and Japanese Laid-Open Patent Publication Nos. 189525 of 1998: 241048 of 1996: 78159 of 1996, and Photochemical Processes in Organized Molecular Systems pp. 437-450 "Electroluminescence in Organic Thin Films", Tetsuo Tsutsui et al.

The EL display device mainly has four color display methods; method of forming three kinds of EL elements that correspond to R (red), G (green), and B (blue), respectively: method of combining an EL element of white luminescence and a color filter (coloring layer): method of combining an EL element of blue or blue-green luminescence and a fluorescent body (fluorescent color conversion layer: CCM): and method of stacking the EL elements that correspond to RGB while using a transparent electrode for a cathode (opposite electrode).

The structure of FIG. 2 is an example in which the method of forming three kinds of EL elements that correspond to RGB is used. Only one pixel is shown in FIG. 2. In fact, pixels, each having the same structure, are formed to correspond to each color of red, green, and blue, and thereby color display can be performed.

The present invention can be performed regardless of the luminescence method, and can use all the four methods. However, since the speed of response of the fluorescent body is slower than that of the EL, and the problem of afterglow occurs, the method in which the fluorescent body is not used is preferable. Additionally, it can be said that a color filter that causes the fall of luminescence brightness should not be used if possible.

A cathode 52 of the EL element is disposed on the EL layer 51. A material that includes magnesium (Mg), lithium (Li) or calcium (Ca) that is small in work function is used as the cathode 52. Preferably, use is made of an electrode made of MgAg (material in which Mg and Ag are mixed in the ratio of Mg:Ag=10:1). Instead a MgAgAl electrode, a LiAl electrode, or LiFAl electrode can be used.

It is preferable to form the cathode 52 continuously without air exposure after the EL layer 51 is former. The reason is that an interface state between the cathode 52 and the EL layer 51 greatly influences the luminous efficiency of the EL element. In this specification, the luminescence element formed by the pixel electrode (anode), the EL layer, and the cathode is called an EL element.

It is necessary to form a layered body comprised of the EL layer 51 and the cathode 52 by each pixel individually. However, the EL layer 51 is quite weak to water, and a normal photolithography technique cannot be used. Therefore, it is preferable to use a physical mask material, such as metal mask, and selectively form it according to a vapor phase method, such as a vacuum deposition method, a sputtering method, or a plasma CVD method.

It is also possible to use an ink jet method, a screen printing method, and the like, as the method of selectively forming the EL layer. However, these methods cannot continuously form the cathode in the current state of the art, and it can be said that the method described above, not the ink jet method, etc., is desirable.

Reference numeral 53 is a protective electrode. This is to protect the cathode 52 from outside water, etc., and, at the same time, connect the cathode 52 of each pixel. For the protective electrode 53, it is preferable to use a low-resistance material including aluminum (Al), copper (Cu), or silver (Ag). A cooling effect to lower the heat of the EL layer can be expected from the protective electrode 53. It is also effective to continue to the protective electrode 53 without air exposure after the EL layer 51 and the cathode 52 are formed.

Reference numeral 54 is a second passivation film, and, preferably, the film thickness thereof is 10 nm-1 μm (200-500 nm preferably). A main purpose to dispose the second passivation film 54 is to protect the EL layer 51 from water. It is also effective to give it a cooling effect. However, the EL layer is weak to heat as mentioned above, and film formation should be performed at a low temperature (ranging from a room temperature to 120° C. preferably). Therefore, it can be said that a desirable film formation method is the plasma CVD method, sputtering method, vacuum deposition method, ion plating method, or solution application method (spin coating method).

Needless to say, all the TFTs shown in FIG. 2 have the silicon films used in the present invention as active layers.

One of the purports of the present invention is to form TFTs that show a high operation speed by using a silicon film that has a peculiar crystal structure in which the continuity of the grain boundary is high as an active layer of the TFT and the crystal orientation is uniform, and, accordingly, perform time-division gradation display of an active matrix type EL display device integral with a driving circuit. Therefore, the present invention is not limited to the structure of the EL display device of FIG. 2, which is just one of the preferred embodiments.

The TFT that uses the silicon film used in the present invention can show a high operation speed, and is therefore apt to undergo deterioration caused by, for example, hot carrier injection. Therefore, as shown in FIG. 2, it is very effective to form TFTs (a switching TFT low sufficiently in OFF-state current and a current controlling TFT strong in hot carrier injection) having different structures according to a function in pixels, in order to manufacture an EL display device that has high reliability and can perform excellent image display (i.e., can show high operational performance).

Embodiment 1

An embodiment of the present invention will be described with reference to FIGS. 5 to 8. A description is here given of a method of simultaneously manufacturing TFTs of a pixel portion and a driving circuit portion around the pixel portion. Concerning the driving circuit, a CMOS circuit that is a base unit is shown in the figure, for a brief description.

Figure 5A:
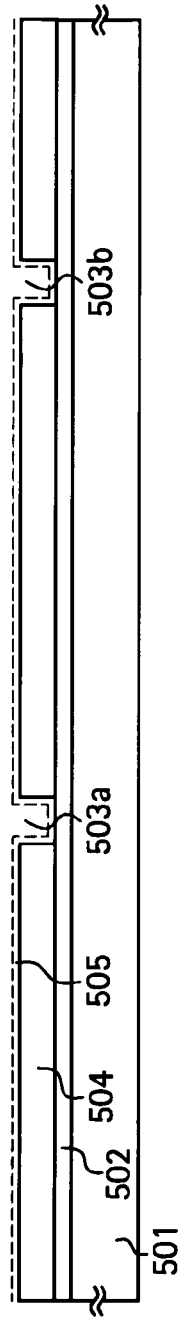
FIGS. 5A-5E show manufacturing steps of the EL display device.

First, a substrate 501 in which a base film (not shown) is disposed on the surface thereof is prepared as shown in FIG. 5(A). In this embodiment, a silicon nitride oxide film whose thickness is 200 nm and another silicon nitride oxide film whose thickness is 100 nm are laminated and are used as a base film on a crystallization glass. At this time, preferably, the concentration of nitrogen of the film contacting the crystallization glass substrate is kept to 10-25 wt %. It is possible to form an element directly on the quartz substrate without any base film, of course.

Thereafter, an amorphous silicon film 502 whose thickness is 45 nm is formed on the substrate 501 by a well-known film formation method. There is no need to limit it to the amorphous silicon film. Instead, a semiconductor film (including a microcrystal semiconductor film) that has an amorphous structure can be used in this embodiment. A compound semiconductor film that has an amorphous structure, such as an amorphous silicon germanium film, also can be used herein.

Figure 5B:
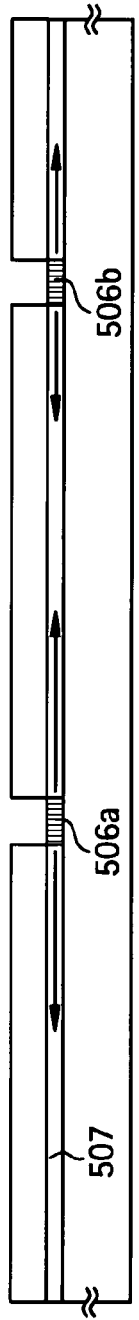
Figure 5C:
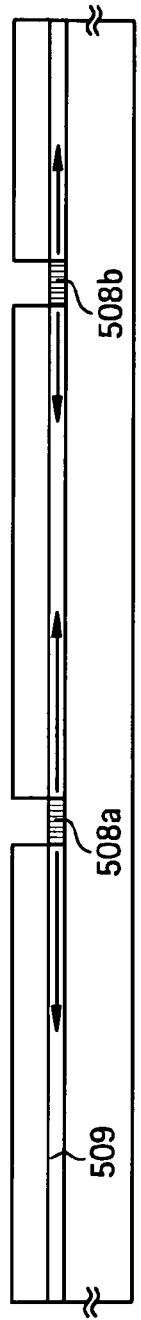
Figure 5D:
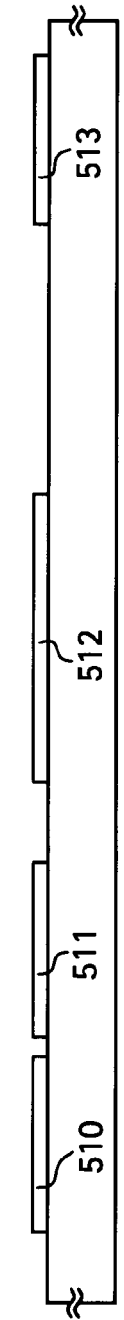

Concerning the steps from here to FIG. 5(C), it is possible to completely cite Japanese Laid-open Patent Publication No. 247735 of 1998 filed by the present applicant. This publication discloses a technique concerning a method of crystallizing a semiconductor film, which uses an element, such as Ni, as a catalyst.

First, a protective film 504 that has openings 503a and 503b is formed. A silicon oxide film 150 nm thick is used in this embodiment. A layer 505 that contains nickel (Ni) is formed on the protective film 504 by a spin court method. Concerning the formation of the Ni containing layer, reference can be made to the above publication.

Figure 19A:
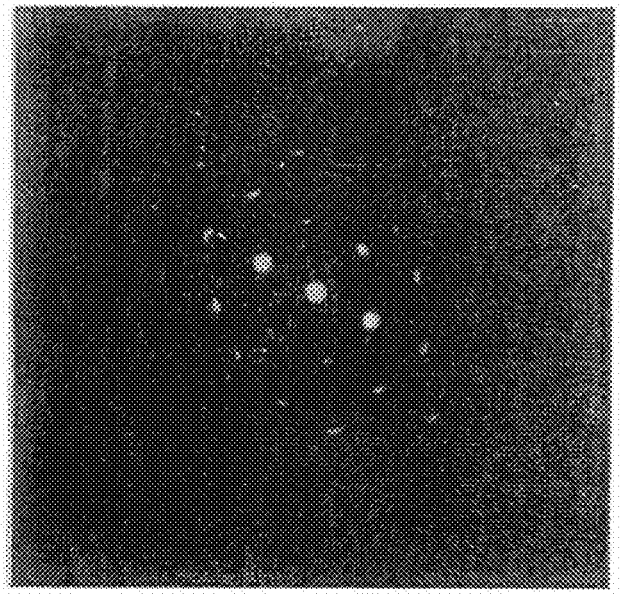
FIGS. 19A and 19B are photographs substituted for a drawing, showing an electron beam diffraction image of a polysilicon film.
Figure 19B:

Thereafter, as shown in FIG. 5(B), heating processing at 570° C. for 14 hours is performed in an inert atmosphere, and the amorphous silicon film 502 is crystallized. At this time, crystallization progresses substantially in parallel with the substrate, starting from regions 506a and 506b (hereinafter, designated as Ni addition region) with which Ni is in contact. As a result, a polysilicon film 507 is formed that has a crystal structure in which bar crystals gather and form lines. It is known that diffraction spots corresponding to the {110} orientation as shown in FIG. 19(A) are observed in an electron beam diffraction photograph at this stage.

Thereafter, as shown in FIG. 5(C), an element (phosphorus preferably) that belongs to 15-family is added to the Ni addition regions 506a and 506b, while leaving the protective film 504 as a mask. Regions 508a and 508b (hereinafter, designated as phosphorus addition region) to which phosphorus was added at high concentration are thus formed.

Thereafter, heat processing at 600° C. for 12 hours is performed in an inert atmosphere as shown in FIG. 5(C). Ni existing in the polysilicon film 507 is moved by this heat processing, and almost all of them are finally captured by the phosphorus addition regions 508a and 508b as shown by the arrow. It is thought that this is a phenomenon caused by the gettering effect of a metallic element (Ni in this embodiment) by phosphorus.

By this process, the concentration of Ni remaining in the polysilicon film 509 is reduced to at least $2\times10^{17}$ atoms/cm$^3$ according to the measurement value by SIMS (mass secondary ion analysis). Although Ni is a lifetime killer for a semiconductor, no adverse influence is given to the TFT characteristic when it is decreased to this extent. Additionally, since this concentration is the measurement limit of the SIMS analysis in the current state of the art, it will show an even lower concentration (less than $2\times10^{17}$ atoms/cm$^3$) in practice.

The polysilicon film 509 can be thus obtained that is crystallized by a catalyst and is decreased to the level in which the catalyst does not obstruct the operation of a TFT. Thereafter, active layers 510-513 that use the polysilicon film 509 only are formed by a patterning process. At this time, a marker to conduct mask alignment in the following patterning should be formed by using the above polysilicon film. (FIG. 5(D))

Figure 5E:

Thereafter, a silicon nitride oxide film 50 nm thick is formed by the plasma CVD method as shown in FIG. 5(E), heating processing at 950° C. for 1 hour is then performed in an oxidation atmosphere, and a thermal oxidation process is performed. The oxidation atmosphere can be an oxygen atmosphere or another oxygen atmosphere in which halogen is added.

In this thermal oxidation process, the oxidation progresses in the interface between the active layer and the silicon nitride oxide film and a polysilicon film whose thickness is about 15 nm is oxidized, so that a silicon oxide film whose thickness is about 30 nm is formed. That is, a gate insulating film 514 of a thickness of 80 nm is formed in which the silicon oxide film 30 nm thick and the silicon nitride oxide film 50 nm thick are laminated. The film thickness of the active layers 510-513 is made 30 nm by the thermal oxidation process.

Figure 6A:
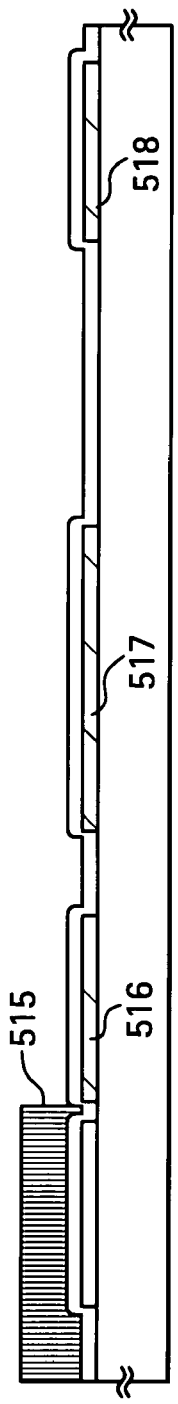
FIGS. 6A-6D show manufacturing steps of the EL display device.

Thereafter, as shown in FIG. 6(A), a resist mask 515 is formed, and an impurity element (hereinafter, designated as p-type impurity element) that gives the p-type through the medium of the gate insulating film 514 is added. As the p-type impurity element, an element that belongs to 13-family representatively, boron or gallium typically, can be used. This (called a channel dope process) is a process for controlling the threshold voltage of a TFT.

In this embodiment, boron is added by the ion dope method in which plasma excitation is performed without the mass separation of diborane ($B_2H_6$). The ion implantation method that performs the mass separation can be used, of course. According to this process, impurity regions 516-518 are formed that include boron at the concentration of $1\times10^{15}$-$1\times10^{18}$ atoms/cm$^3$ ($5\times10^{19}$-$5\times10^{17}$ atoms/cm$^3$ representatively).

Figure 6B:
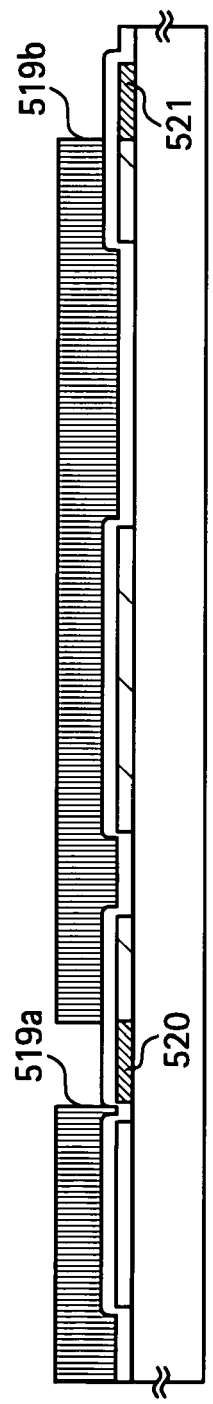

Thereafter, resist masks 519a and 519b are formed as shown in FIG. 6(B), and an impurity element (hereinafter, designated as n-type impurity element) that gives the n-type through the medium of the gate insulating film 514 is added. As the n-type impurity element, an element that belongs to 15-family representatively, phosphorus or arsenic typically, can be used. In this embodiment, a plasma doping method in which plasma excitation is performed without the mass separation of phosphine ($PH_3$) is used. Phosphorus is added in the concentration of $1\times10^{18}$ atoms/cm$^3$. The ion implantation method that performs mass separation can be used, of course.

A dose amount is adjusted so that the n-type impurity element is included in the n-type impurity regions 520, 521 formed by this process at the concentration of $2\times10^{16}$-$5\times10^{19}$ atoms/cm$^3$ ($5\times10^{17}$-$5\times10^{18}$ atoms/cm$^3$ representatively).

Figure 6C:
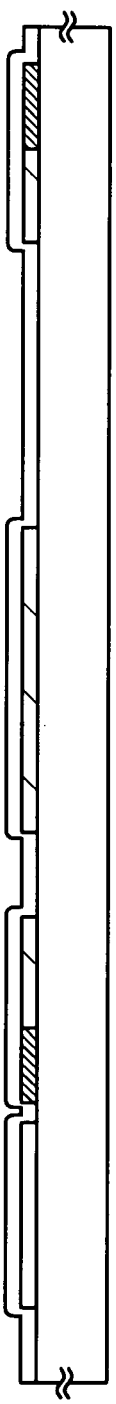
Figure 6D:
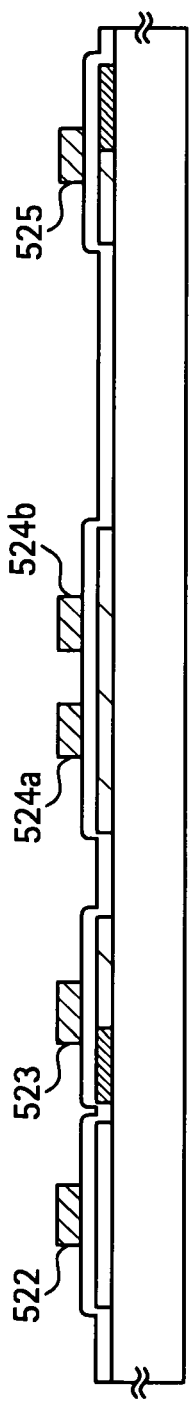

Thereafter, a process is performed for activating the added n-type impurity element and the added p-type impurity element as shown in FIG. 6(C). There is no need to limit the activation means, but, since the gate insulating film 514 is disposed, the furnace annealing process that uses an electrothermal furnace is desirable. Additionally, it is preferable to perform heat processing at a temperature as high as possible because there is a possibility of having damaged the interface between the active layer and the gate insulating film of a part that is a channel formation region in the process of FIG. 6(A).

Since the crystallization glass with high heat resistance is used in this embodiment, the activating process is performed by the furnace annealing processing at 800° C. for 1 hour. The thermal oxidation can be performed keeping a processing atmosphere in an oxidizing atmosphere, or the heat processing can be performed in an inert atmosphere. However, the activating process is not indispensable.

This process clarifies the edge of the n-type impurity regions 520, 521, namely, the boundary (junction) between the n-type impurity regions 520, 521 and the region (p-type impurity region formed by the process of FIG. 6(A)) around the n-type impurity regions 520, 521, where the n-type impurity element is not added. This means that the LDD region and the channel formation region can form an excellent junction when a TFT is later completed.

Thereafter, a conductive film 200-400 nm thick is formed, and patterning is performed, so that gate electrodes 522-525 are formed. The gate electrode can be made of a conductive film of a single-layer, however, preferably, a lamination film, such as two-layer or three-layer film, is used when necessary. A known conductive film can be used as the material of the gate electrode.

Specifically, use can be made of a film of an element selected from the group consisting of tantalum (Ta), titanium (Ti), molybdenum (Mo), tungsten (W), chrome (Cr), and silicon (Si) having conductivity, a film of a nitride of the aforementioned elements (tantalum nitride film, tungsten nitride film, or titanium nitride film representatively); an alloy film of a combination of the aforementioned elements (Mo—W alloy or Mo—Ta alloy representatively); or, a silicide film of the aforementioned elements (tungsten silicide film or titanium silicide film representatively). They can have a single-layer structure or a lamination-layer structure, of course.

In this embodiment, a lamination film is used that is made of a tungsten nitride (WN) film 50 nm thick and a tungsten (W) film 350 nm thick. This can be formed by the sputtering method. By adding an inert gas, such as Xe or Ne, as a spattering gas, the film can be prevented from peeling off because of stress.

At this time, the gate electrodes 523, 525 are formed to overlap with part of the n-type impurity regions 520, 521, respectively, with the gate insulating film 514 therebetween. The overlapping part is later made an LDD region overlapping with the gate electrode. According to the sectional view of the figure, the gate electrodes 524a and 524b are seen as separate, in fact, they are connected electrically to each other.

Figure 7A:
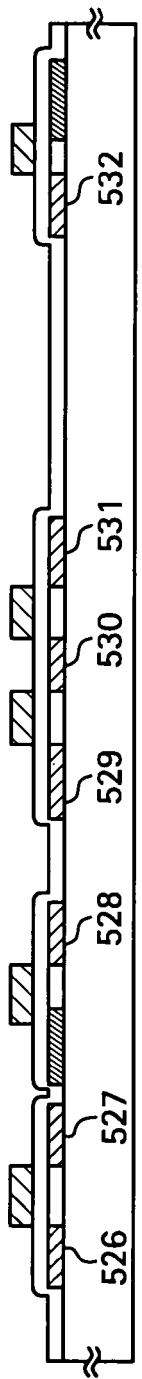
FIGS. 7A-7D show manufacturing steps of the EL display device.

Thereafter, with the gate electrodes 522-525 as masks, an n-type impurity element (phosphorus in this embodiment) is added self-adjustably, as shown in FIG. 7(A). At this time, an adjustment is performed so that phosphorus is added to the thus formed impurity regions 526-532 at the concentration of ½-¹/₁₀ (⅓-¼ representatively) of that of the n-type impurity regions 520, 521. Preferably, the concentration is $1 \times 10^{16}$-$5 \times 10^{18}$ atoms/cm³ ($3 \times 10^{17}$-$3 \times 10^{18}$ atoms/cm³ typically).

Figure 7B:
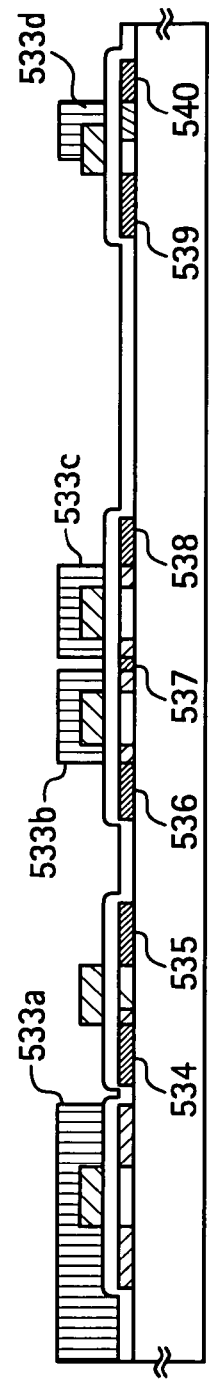

Thereafter, as shown in FIG. 7(B), resist masks 533a-533d are formed to cover the gate electrode, an n-type impurity element (phosphorus in this embodiment) is then added, and impurity regions 534-540 including a high concentration of phosphorus are formed. The ion dope method using phosphine ($PH_3$) is applied also herein, and an adjustment is performed so that the concentration of phosphorus in these regions is $1 \times 10^{20}$-$1 \times 10^{21}$ atoms/cm³ ($2 \times 10^{20}$-$5 \times 10^{20}$ atoms/cm³ representatively).

A source region or a drain region of the n-channel type TFT is formed through this process, and the switching TFT leaves a part of the n-type impurity regions 529-531 formed in the process of FIG. 7(A). The left region corresponds to the LDD regions 15a-15d of the switching TFT of FIG. 2.

Figure 7C:
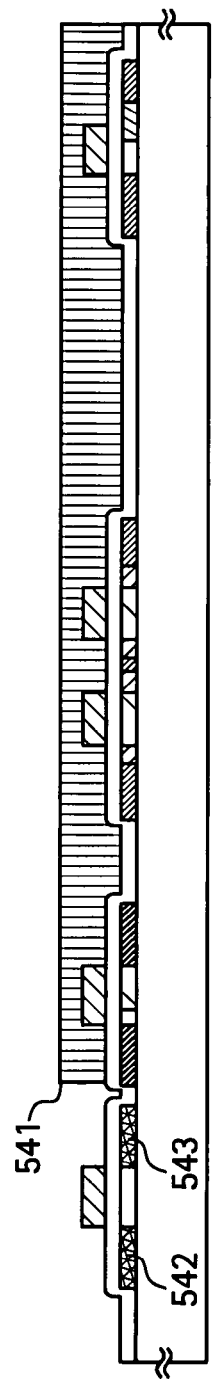

Thereafter, as shown in FIG. 7(C), the resist masks 533a-533d are removed, and a resist mask 541 is newly formed. A p-type impurity element (boron in this embodiment) is then added, and impurity regions 542, 543 including a high concentration of boron are formed. Herein, according to the ion dope method using diborane ($B_2H_6$), boron is added to obtain a concentration of $3 \times 10^{20}$-$3 \times 10^{21}$ atoms/cm³ ($5 \times 10^{20}$-$1 \times 10^{21}$ atoms/cm³ representatively).

Phosphorus has been already added to the impurity regions 542, 543 at a concentration of $1 \times 10^{20}$-$1 \times 10^{21}$ atoms/cm³. Boron added herein has at least three times as high concentration as the added phosphorus. Therefore, the impurity region of the n-type formed beforehand is completely changed into that of the p-type, and functions as an impurity region of the p-type.

Figure 7D:
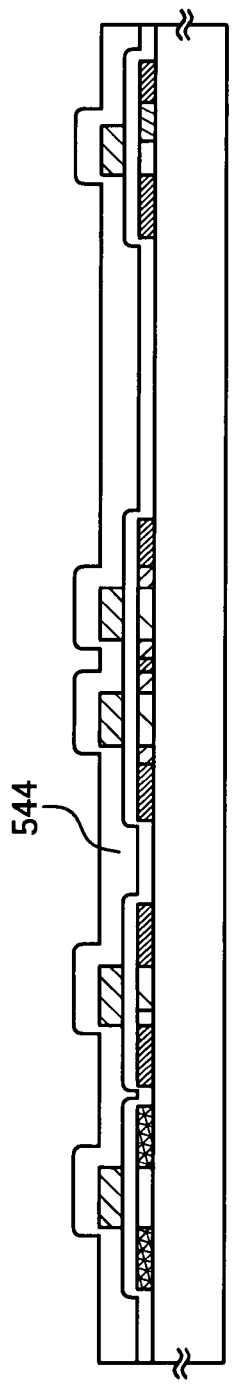

Thereafter, as shown in FIG. 7(D), the resist mask 541 is removed, and then a first interlayer insulating film 544 is formed. As the first interlayer insulating film 544, an insulating film that includes silicon is used in the form of a single-layer structure or a stacked-layer structure as a combination thereof. Preferably, the film thickness thereof is 400 nm-1.5 µm. In this embodiment, a structure is created in which an 800 nm-thick silicon oxide film is stacked on a 200 nm-thick silicon nitride oxide film.

Thereafter, the n-type or p-type impurity element added at each concentration is activated. The furnace annealing method is desirable as an activation means. In this embodiment, heat treatment is performed at 550° C. for 4 hours in a nitrogen atmosphere in an electrothermal furnace.

Heat treatment is further performed at 300-450° C. for 1-12 hours in an atmosphere that includes hydrogen of 3-100% for hydrogenation. This is a process to hydrogen-terminate an unpaired connector of a semiconductor film by thermally excited hydrogen. As another means for hydrogenation, plasma hydrogenation (hydrogen excited by plasma is used) can be performed.

Hydrogenation can be performed during the formation of the first interlayer insulating film 544. In more detail, the 200 nm-thick silicon nitride oxide film is formed, and hydrogenation is performed as mentioned above, and thereafter the remaining 800 nm-thick silicon oxide film can be formed.

Figure 8A:
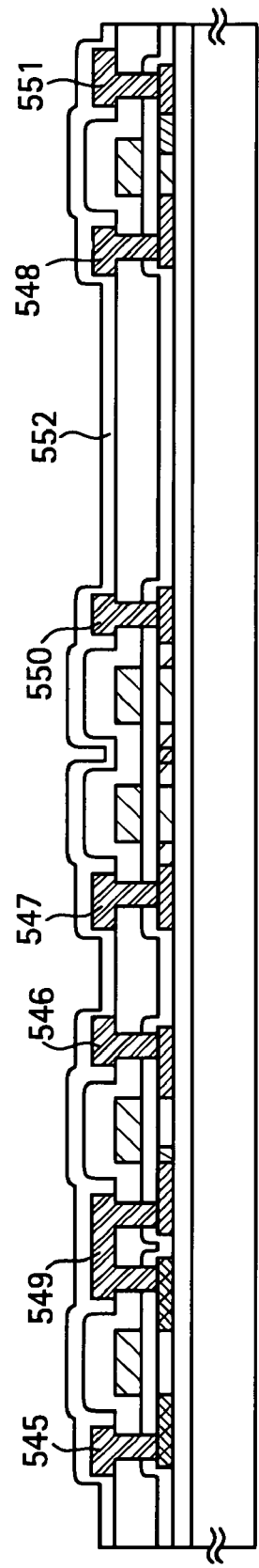
FIGS. 8A-8C shows manufacturing steps of the EL display device.

Thereafter, as shown in FIG. 8(A), contact holes are made in the first interlayer insulating film 544, and source wiring lines 545-548 and drain wiring lines 549-551 are formed. In this embodiment, this electrode is formed with a lamination film of a three-layer structure in which a 100 nm-thick Ti film, a 300 nm-thick aluminum film that includes Ti, and a 150 nm-thick Ti film are continuously formed according to the sputtering method. Other conductive films can be used, of course.

Thereafter, a first passivation film 552 is formed to be 50-500 nm thick (200-300 nm thick representatively). In this embodiment, a 300 nm-thick silicon nitride oxide film is used as the first passivation film 552. A silicon nitride film can be substituted for this.

At this time, it is effective to perform plasma treatment by the use of gas that includes hydrogen, such as $H_2$ or $NH_3$, prior to the formation of the silicon nitride oxide film. Hydrogen excited by this preprocess is supplied to the first interlayer insulating film 544, and, through heat treatment, the film quality of the first passivation film 552 is improved. At the same time, since hydrogen that is added to the first interlayer insulating film 544 diffuses onto the lower side, the active layer can be effectively hydrogenated.

Figure 8B:
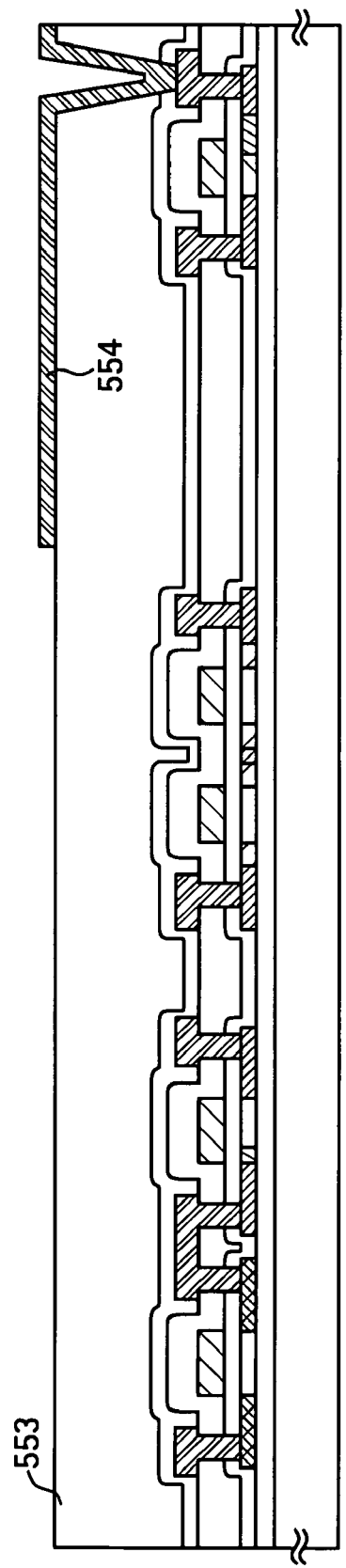

Thereafter, as shown in FIG. 8(B), a second interlayer insulating film 553 made of organic resin is formed. Polyimide, acrylic fiber, or BCB (benzocyclobutene) can be used as the organic resin. Especially, since the second interlayer insulating film 553 is required to flatten the level differences formed by TFTs, an acrylic film excellent in smoothness is desirable. An acrylic film is formed to be 2.5 μm thick in this embodiment.

Thereafter, contact holes that reach the drain wiring line 551 are made in the second interlayer insulating film 553 and the first passivation film 552, and a pixel electrode 554 (anode) is formed. In this embodiment, an indium oxide/tin (ITO) film is formed to be 110 nm thick, and it is made a pixel electrode by patterning. A transparent conductive film can be used in which zinc oxide (ZnO) of 2-20% is mixed with indium oxide. This pixel electrode functions as the anode of the EL element.

Thereafter, an insulating film (a silicon oxide film in this embodiment) that includes silicon is formed to be 500 nm thick, an opening is then formed at the position corresponding to the pixel electrode 554, and a third interlayer insulating film 555 is formed. It is possible to easily form a tapered sidewall by using the wet etching method when the opening is formed. If the sidewall of the opening does not have a sufficiently gentle slope, deterioration of the EL layer caused by level differences will lead to an important problem.

Thereafter, an EL layer 556 and a cathode (MgAg electrode) 557 are continuously formed without air exposure by the vacuum deposition method. Preferably, the film thickness of the EL layer 556 is 800-200 nm (100-200 nm typically), and that of the cathode 557 is 180-300 nm (200-250 nm typically).

In this process, an EL layer and a cathode are sequentially formed for a pixel corresponding to red, a pixel corresponding to green, and a pixel corresponding to blue. However, since the EL layer is poor in tolerance to solutions, they must be independently formed for each color without using the photolithography technique. Thus, it is preferable to conceal pixels except a desired one by the use of the metal mask, and selectively form an EL layer and a cathode for the desired pixel.

In detail, a mask is first set for concealing all pixels except a pixel corresponding to red, and an EL layer and a cathode of red luminescence are selectively formed by the mask. Thereafter, a mask is set for concealing all pixels except a pixel corresponding to green, and an EL layer and a cathode of green luminescence are selectively formed by the mask. Thereafter, as above, a mask is set for concealing all pixels except a pixel corresponding to blue, and an EL layer and a cathode of blue luminescence are selectively formed by the mask. In this case, the different masks are used for the respective colors. Instead, the same mask may be used for them. Preferably, processing is performed without breaking the vacuum until the EL layer and the cathode are formed for all the pixels.

A known material can be used for the EL layer 556. Preferably, that is an organic material in consideration of driving voltage. For example, the EL layer can be formed with a four-layer structure consisting of a positive hole injection layer, a positive hole transporting layer, a luminescent layer, and an electronic injection layer. The MgAg electrode is used as the cathode of the EL element in this embodiment. Known other materials can be used instead of it.

As the protective electrode 558, a conductive film largely composed of aluminum can be used. The protective electrode 558 can be formed according to the vacuum deposition method by using a mask different from the mask when the EL layer and the cathode are formed Preferably, it is continuously formed without air exposure after the EL layer and the cathode are formed.

At the final stage, a second passivation film 559 made of a silicon nitride film is formed to be 300 nm thick. In practice, the protective electrode 558 functions to protect the EL layer from, for example, water. In addition, the reliability of the EL element can be further improved by forming the second passivation film 559.

Figure 8C:
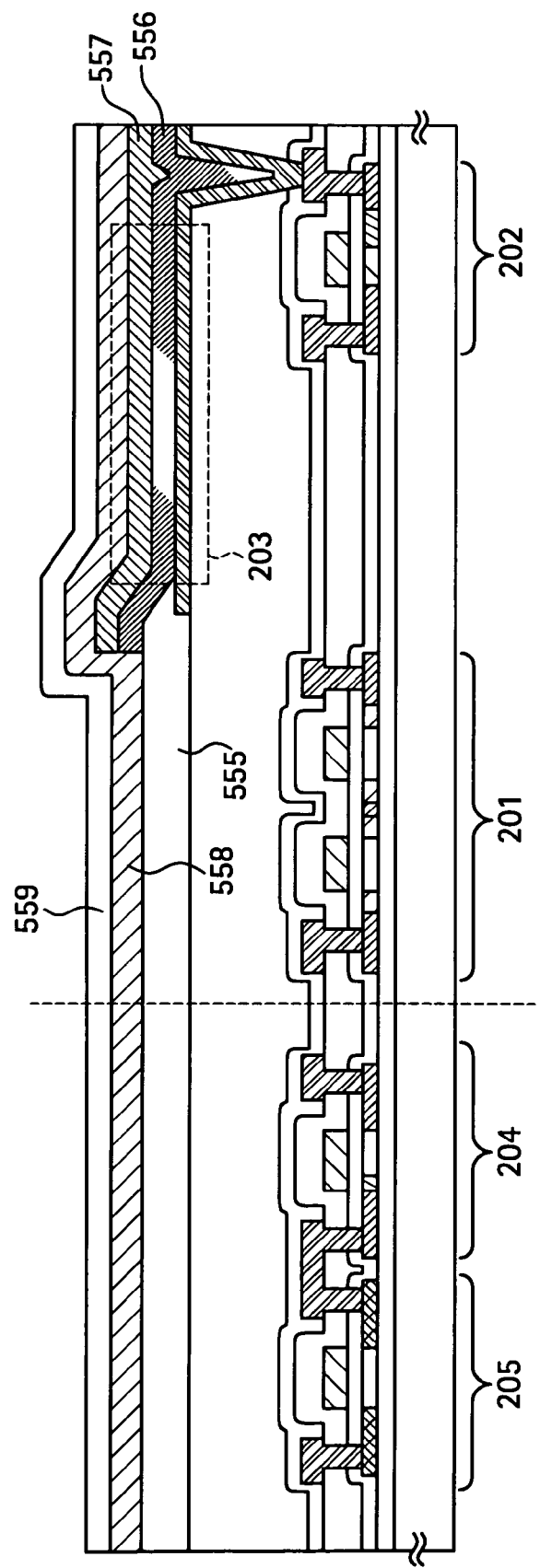

An active matrix type EL display device constructed as shown in FIG. 8(C) is completed. In practice, preferably, the device is packaged (sealed) by a highly airtight protective film (laminate film, ultraviolet cured resin film, etc.) or a housing material such as a ceramic sealing can, in order not to be exposed to the air when completed as shown in FIG. 8(C). In that situation, the reliability (life) of the EL layer is improved by making the inside of the housing material an inert atmosphere or by placing a hygroscopic material (for example, barium oxide) therein.

After airtightness is improved by, for example, packaging, a connector (flexible print circuit: FPC) for connecting a terminal drawn from the element or circuit formed on the substrate to an external signal terminal is attached, and a product is completed. In this specification, the EL display device, thus wholly prepared for market, is called EL module.

Figure 11:
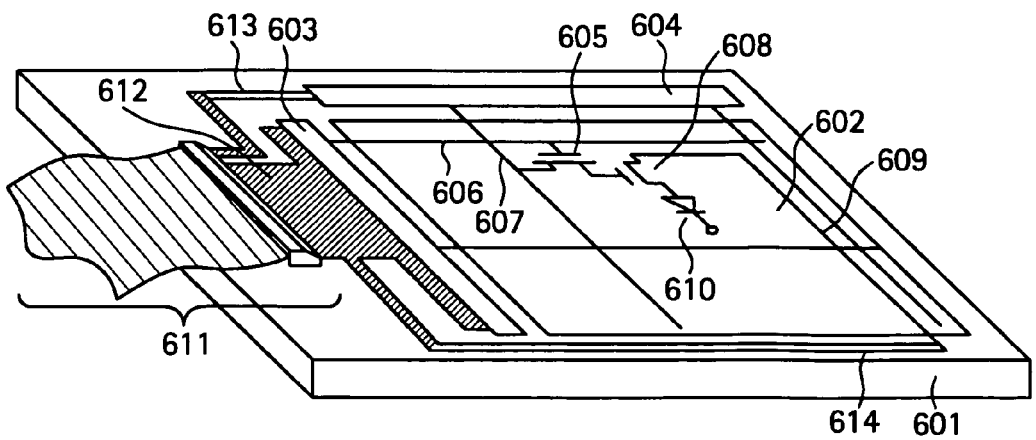
FIG. 11 shows an external appearance of an EL module.

Now, the structure of the active matrix type EL display device of this embodiment will be described with reference to the perspective view of FIG. 11. The active matrix type EL display device of this embodiment is made up of a pixel portion 602, a gate signal side driving circuit 603, and a data signal side driving circuit 604, each formed on a glass substrate 601. A switching TFT 605 of the pixel portion is an n-channel type TFT, and is disposed at the intersection of a gate wiring line 606 connected to the gate signal side driving circuit 603 and a source wiring line 607 connected to the data signal side driving circuit 604. The drain of the switching TFT 605 is connected to the gate of a current controlling TFT 608.

The source of the current controlling TFT 608 is connected to a current-feed line 609, and the drain of the current controlling TFT 608 is connected to an EL element 610. A predetermined voltage is applied to the cathode of the EL element 610.

A FPC 611 which is an external input-output terminal is provided with input wiring lines (connection wiring lines) 612, 613 for transmitting a signal to the driving circuit, and an input wiring line 614 connected to the current-feed line 609.

Figure 12A:
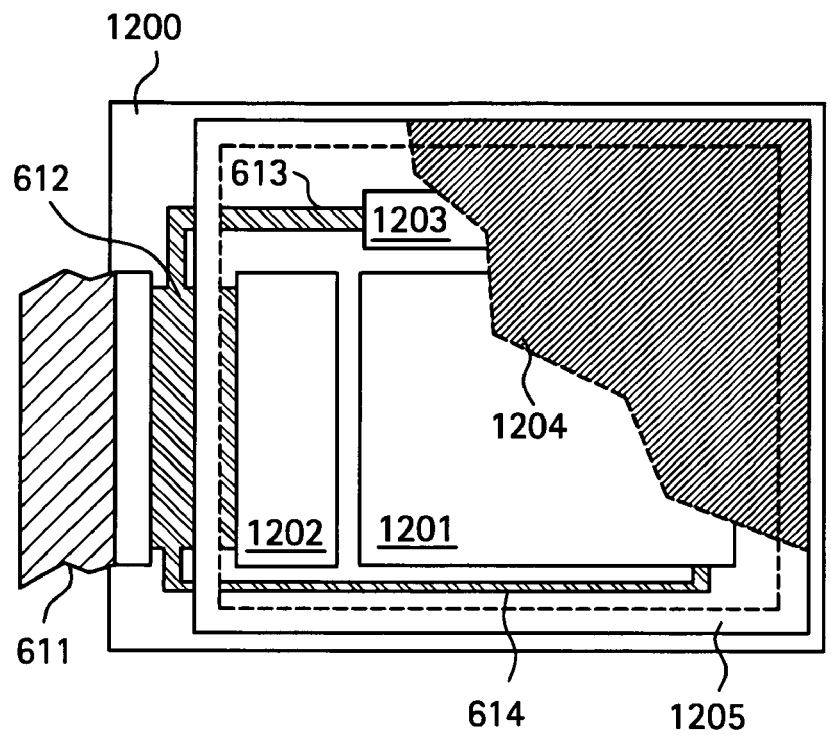
FIGS. 12A and 12B show external appearances of the EL module.

The EL module of this embodiment including housing materials will now be described with reference to FIGS. 12(A) and 12(B). Reference characters used in FIG. 11 are again used when necessary.

A pixel portion 1201, a data signal side driving circuit 1202, and a gate signal side driving circuit 1203 are formed on a substrate 1200. Various wiring lines from each driving circuit are connected to external equipment via the input wiring lines 612-614 and the FPC 611.

At this time, a housing material 1204 is disposed so as to enclose at least the pixel portion, preferably the pixel portion and the driving circuit. The housing material 1204 is shaped to have a concave portion whose internal dimension is larger than the external dimension of the EL element, or is shaped like a sheet. The housing material 1204 is fixed to the substrate 1200 by an adhesive 1205 so as to form closed space in cooperation with the substrate 1200. At this time, the EL element is in a state of being completely enclosed in the closed space, and is completely intercepted from the outside air. A plurality of housing materials 1204 can be disposed.

Preferably, the quality of the housing material 1204 is an insulating substance such as glass or polymer. For example, there is amorphous glass (borosilicate glass, quartz, etc.), crystallization glass, ceramics glass, organic resin (acrylic resin, styrene resin, polycarbonate resin, epoxy resin, etc.) or silicone resin. In addition, ceramics can be used. It is also possible to use metallic materials, such as stainless alloy, if the adhesive 1205 is an insulating material.

As the quality of the adhesive 1205, epoxy resin, acrylate resin, etc., can be used. In addition, thermosetting resin or light curing resin can be used as the adhesive. However, it is required to be a material that does not transmit oxygen and water to the utmost.

Preferably, a gap 1206 between the housing material and the substrate 1200 is filled with inert gas (argon, neon, helium, or nitrogen). However, it is not limited to gas. An inert liquid can be used (for example, liquid fluorocarbon typified by perfluoroalkane). A liquid described in, for example, Japanese Laid-Open Patent Publication No. 78519 of 1996 can be used as the inert liquid.

It is also effective to dispose a drying agent in the gap 1206. A dryer described in Japanese Laid-open Patent Publication No. 148066 of 1997 can be used as the drying agent. Typically, barium oxide can be used.

Figure 12B:
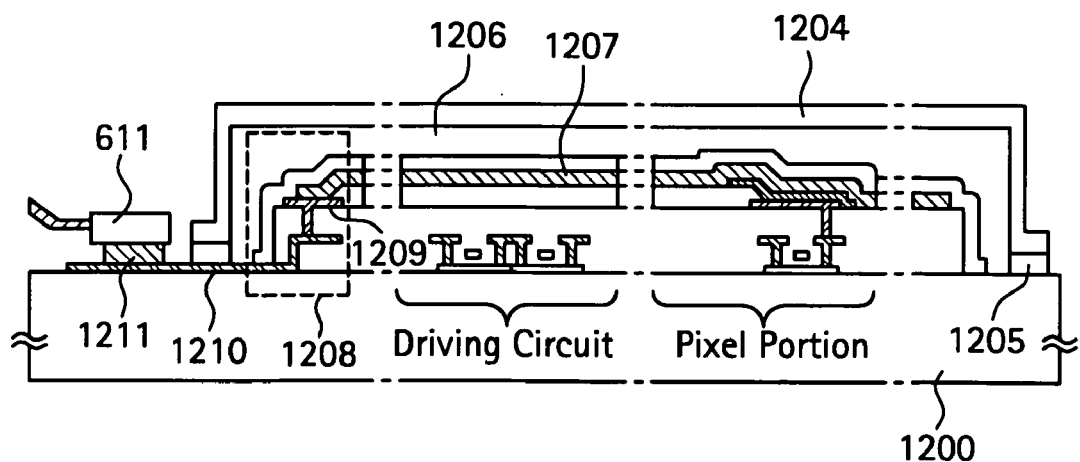

As shown in FIG. 12(B), the pixel portion is provided with a plurality of pixels, each having individually isolated EL elements. All of them have a protective electrode 1207 as a common electrode. In this embodiment, a description was given as follows: it is preferable to continuously form the EL layer, the cathode (MgAg electrode), and the protective electrode without air exposure. Instead, if the EL layer and the cathode are formed by using the same mask, and only the protective electrode is formed by another mask, a structure of FIG. 12(B) will be realized.

At this time, the EL layer and the cathode can be disposed on the pixel portion only, and are not required to be disposed on the driving circuit. No problem will occur even if they are disposed on the driving circuit, of course. However, they should not be disposed thereon in consideration of the fact that an alkali metal is included in the EL layer.

The protective electrode 1207 is connected to an input wiring line 1210 in the region shown by reference numeral 1208 through the medium of a connection wiring line 1209 that is made of the same material as the pixel electrode. The input wiring line 1210 is a current-feed line to give a predetermined voltage (earth potential, specifically 0V in this embodiment) to the protective electrode 1207, and is connected to the FPC 611 through the medium of a conductive paste material 1211.

Now, a description will be given of the manufacturing steps to realize a contact structure in the region 1208 with reference to FIG. 13.

First, the state of FIG. 8(A) is obtained according to the process of this embodiment. At this time, the first interlayer insulating film 544 and the gate insulating film 514 are removed at the edge of the substrate (i.e., region shown by reference numeral 1208 in FIG. 12(B)), and the input wiring line 1210 is formed thereon. It is formed at the same time as the source wiring line and the drain wiring line of FIG. 8(A) are formed, of course. (FIG. 13(A))

Thereafter, when the second interlayer insulating film 553 and the first passivation film 552 are etched in FIG. 8(B), the region shown by reference numeral 1301 is removed, and an opening 1302 is formed. The wiring line 1209 is then formed so as to cover the opening 1302. The connection wiring line 1209 is formed simultaneously with the pixel electrode 554 in FIG. 8(B), of course. (FIG. 13B))

In this state, the formation process of the EL element (formation process of the third interlayer insulating film, the EL layer, and the cathode) is performed in the pixel portion. At this time, the third interlayer insulating film and the EL element are designed not to be formed in the region shown in FIG. 13 by using a mask etc. The cathode 557 is then formed, and the protective electrode 558 is formed by using another mask. As a result, the protective electrode 558 and the input wiring line 1210 are electrically connected through the connection wiring line 1209. The second passivation film 559 is then provided, and the state of FIG. 13(C) is obtained.

The contact structure of the region shown by reference numeral 1208 of FIG. 12(B) is realized by the steps mentioned above. The input wiring line 1210 is connected to the FPC 611 through a gap (note: this is filled with the adhesive 1205. That is, the adhesive 1205 is required to have a thickness to sufficiently flatten the level difference of the input wiring line) between the housing material 1204 and the substrate 1200. The input wiring line 1210 was described here. In the same way, other input wiring lines 612-614 are also connected to the FPC 611, passing under the housing material 1204.

Embodiment 2

In this embodiment, the structure of a pixel different from that of FIG. 1(B) is shown in FIG. 14.

In this embodiment, the two pixels shown in FIG. 1(B) are arranged to be symmetrical with respect to the current-feed line 110 for giving earth potential. That is, the current-feed line 110 is made common to the two adjoining pixels, as shown in FIG. 14, and thereby the number of required wiring lines is decreased. There is no need to change the structure of TFTs disposed in the pixels.

This arrangement makes it possible to manufacture an even finer pixel portion, and improve the quality of an image.

In addition, the common structure of the current-feed line 110 makes it possible to expand the line width of the current-feed line 110 without the brightness of an image falling because the margin of the line width of the current-feed line 110 increases. Thus, the influence of a voltage drop of the current-feed line 110 can be reduced, and the voltage supplied from the current-feed line 110 can be prevented from varying according to the position of a pixel.

The structure of this embodiment can be easily achieved according to the manufacturing steps of embodiment 1.

Embodiment 3

Figure 15:
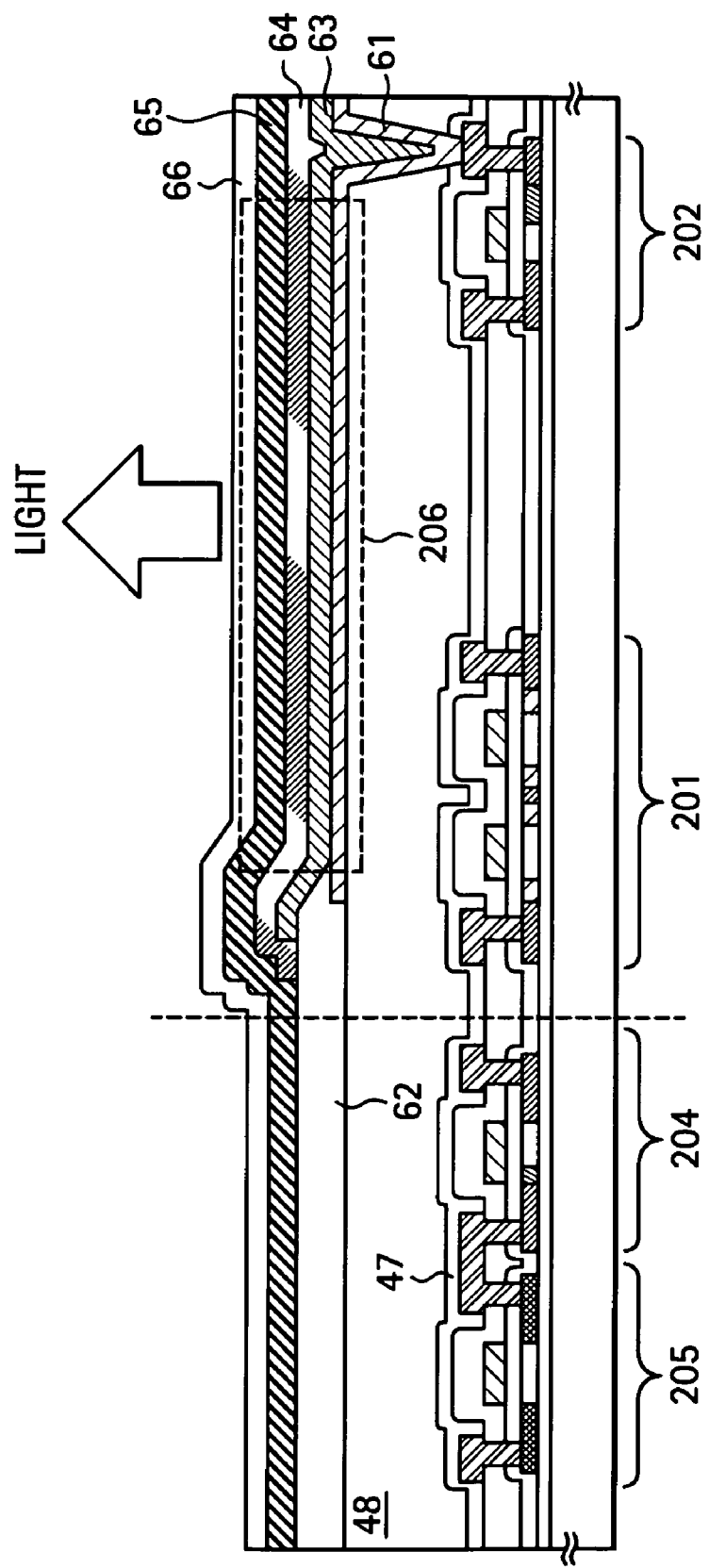
FIG. 15 shows a sectional structure of the EL display device.

In this embodiment, a description of forming a pixel portion having a structure different from that of FIG. 1 is given with reference to FIG. 15. The same steps as in embodiment 1 can be followed up to the step for forming the second interlayer insulating film 48. The switching TFT 201 covered with the second interlayer insulating film 48 and the current controlling TFT 202 each have the same structure as in FIG. 1, and a description thereof is omitted here.

In this embodiment, contact holes are made in the second interlayer insulating film 48 and the first passivation film 47, and then the pixel electrode 61 is formed. A 200 nm-thick aluminum alloy film (aluminum film that contains titanium of 1 wt %) is disposed as the pixel electrode 61 in this embodiment. Any material can be used as the pixel electrode on the condition that it is metallic. Preferably, it has a high reflectance.

The third interlayer insulating film 62 made of a silicon oxide film is formed thereon to be 300 nm thick. A 230 nm-thick MgAg electrode is then formed as the cathode 63. And, as the EL layer 64, a 20 nm-thick electronic transporting layer, a 40 nm-thick luminescent layer, and a 30 nm-thick positive hole transporting layer are formed in this order from below. There is a need to form the EL layer 64 so as to be a slightly larger pattern than the cathode 63. This makes it possible to prevent the cathode 63 from short-circuiting with the anode 65 which is formed later.

At this time, the cathode 63 and the EL layer 64 are continuously formed without air exposure by the use of a vacuum deposition machine of a multi chamber method (also called cluster tool method). In more detail, the cathode 63 is first formed on all pixels by the first mask, and then the red-luminescence EL layer is formed by the second mask. While finely controlling and moving the second mask, the green-luminescence EL layer and the blue-luminescence EL layer are sequentially formed.

The second mask is simply moved in such a manner as above when pixels corresponding to RGB are arranged like a stripe. However, in order to realize a pixel structure of a so-called delta arrangement, use can be individually made of a third mask for the green-luminescence EL layer and a fourth mask for the blue-luminescence EL layer.

After forming the EL layer 64 in this way, the anode 65 is formed thereon to be 110 nm thick. The anode 65 is made of a transparent conductive film (in this embodiment, a thin film in which zinc oxide of 10 wt % is contained in an ITO film). The EL element 206 is thus formed, and the second passivation film 66 is formed with the material shown in embodiment 1. As a result, a pixel constructed as shown in FIG. 15 is completed.

In the structure of this embodiment, red, green, or blue light generated in each pixel radiates to the side opposite to the substrate on which the TFTs are formed. Therefore, almost all the areas in the pixel, i.e., the region where TFTs are formed can be used as an effective luminescent region. As a result, the effective luminescent area of a pixel is greatly increased, and the brightness or contrast ratio (ratio between light and shade) of an image is improved.

The structure of this embodiment can be freely combined with any one of the structures of embodiments 1 and 2.

Embodiment 4

Figure 16:
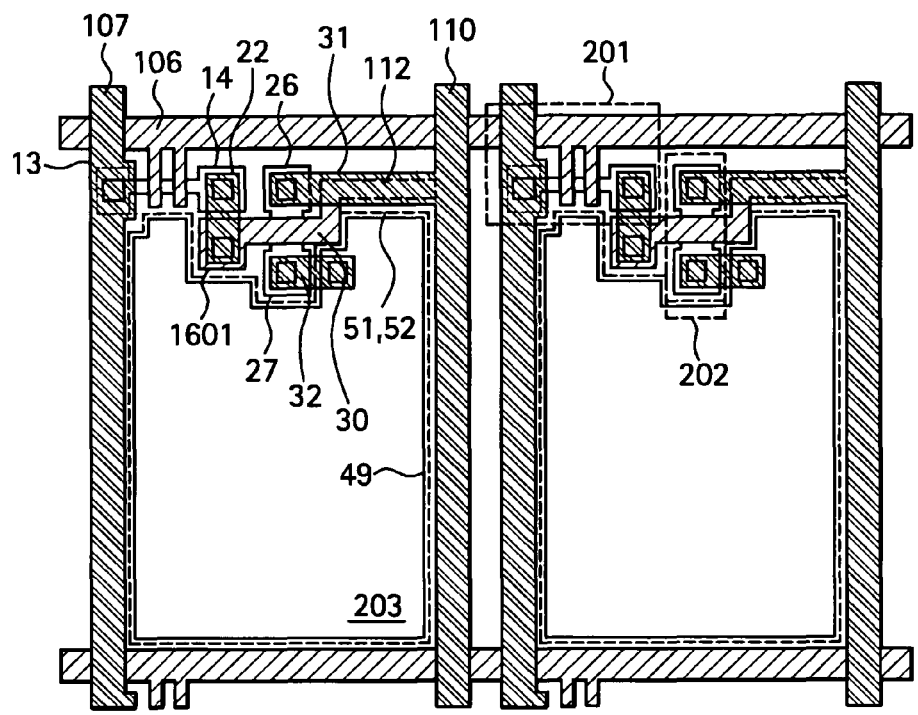
FIG. 16 shows an upper face structure of the pixel portion of the EL display device.

In this embodiment, a description is given of an example of the pixel structure of the active matrix type EL display device manufactured by embodiment 1. FIG. 16 is used for the description. In FIG. 16, reference characters of FIG. 1 or 2 are applied to parts corresponding to FIG. 1 or 2.

In FIG. 16, reference character 201 is a switching TFT. This includes a source region 13, a drain region 14, and a gate wiring line (servable also as a gate electrode) 106. Reference numeral 202 is a current controlling TFT. This includes a source region 26, a drain region 27, and a gate electrode 30. The current controlling TFT 202 and the pixel electrode 49 are connected electrically through the drain wiring line 32. The dotted lines shown by 51 and 52 indicate the position where the EL layer 51 and the cathode 52 are formed. The EL element 203 is made up of the pixel electrode 49, the EL layer 51, and the cathode 52.

At this time, the drain wiring line 22 of the switching TFT 201 is electrically connected to the gate electrode 30 of the current controlling TFT 202 by an electric contact 1601. The gate electrode 30 forms a capacitance storage 112 in a part overlapping with the source wiring line 31 of the current controlling TFT 202. The source wiring line 31 is connected to the current-feed line 110.

The pixel structure of FIG. 16 in this embodiment is not to limit the present invention at all, and is merely a preferred example. A performer of the present invention can properly determine where to form the switching TFT, the current controlling TFT, and the capacitance storage. This embodiment can be carried out by freely combining the structure of this embodiment and those of embodiments 1 to 3.

Embodiment 5

Figure 17:
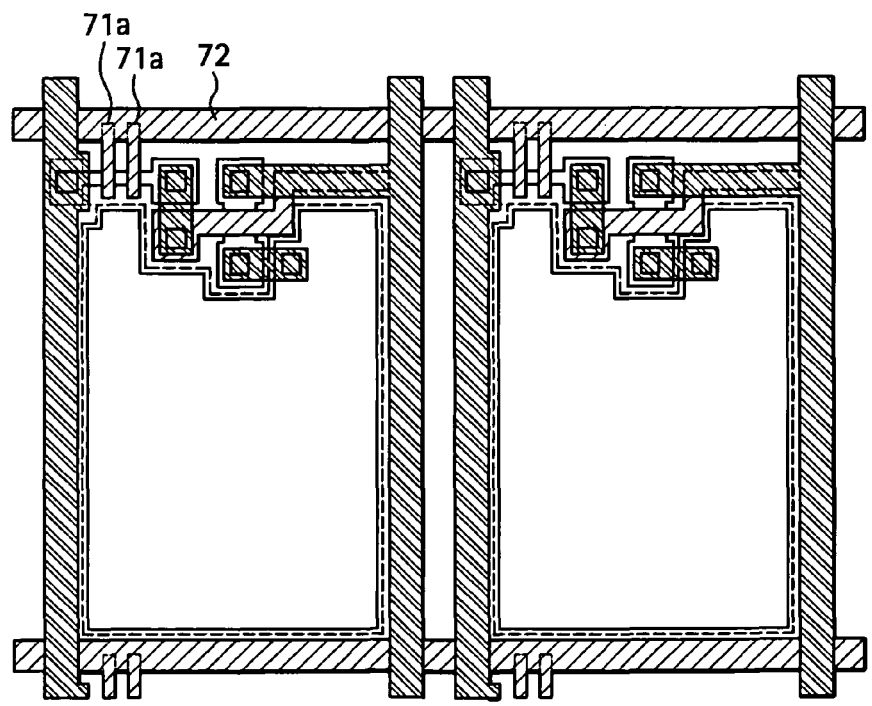
FIG. 17 shows an upper face structure of the pixel portion of the EL display device.

In this embodiment, a description is given of a case in which the pixel structure of the active matrix type EL display device is made different from that of embodiment 4. Specifically, an example in which the material of the gate wiring line is made different in the pixel structure shown in FIG. 16 is shown in FIG. 17. FIG. 17 is different from FIG. 16 only in the structure of the gate wiring line. Therefore, a specifically detailed description is omitted.

In FIG. 17, reference characters 71a and 71b are each a gate electrode made of a tungsten nitride film and a lamination film of a tungsten film, as in the gate electrode of embodiment 1. As shown in FIG. 17, they can be designed to be individually isolated patterns, or to be electrically connected patterns. They are in an electrically floating state when formed.

As the gate electrodes 71a and 71b, use can be made of other conductive films, such as a lamination film of a tantalum nitride film and a tantalum film, or an alloy film of molybdenum and tungsten. However, desirably, the film is superior in processability so as to form a fine line with a width less than 3 μm (2 μm preferably). Additionally, desirably, it is not a film including such an element as to diffuse a gate insulating film and enter an active layer.

On the other hand, for the gate wiring line 72, use is made of a conductive film having a lower resistance than the gate electrodes 71a and 71b. Representatively, it is an alloy film largely composed of aluminum or an alloy film largely composed of copper. The gate wiring line 72 is not required to have especially fine processability. In addition, the gate wiring line 72 does not overlap with an active layer, and, therefore, does not cause any trouble even if it contains aluminum or copper which diffuses easily in an insulating film.

When constructing the structure of this embodiment, in the process of FIG. 7(D) of embodiment 1, an activating step is performed prior to the formation of the first interlayer insulating film 544. In this case, heat treatment is performed in a state in which the gate electrodes 71a and 71b are exposed. However, the gate electrodes 71a and 71b will not be oxidized if the heat treatment is performed in a sufficiently inert atmosphere, preferably in an inert atmosphere whose oxygen concentration is 1 ppm or less. Accordingly, there is no fear that resistance increases because of oxidation, or removal becomes difficult because of being covered with the insulating film (oxide film).

After the activating step is completed, a conductive film mainly composed of aluminum or copper is formed, and a gate wiring line 72 is formed according to patterning. At this time, an excellent ohmic contact is secured in a part where the gate electrodes 71a, 71b are in contact with the gate wiring line 72, and, as a result, a predetermined gate voltage can be applied to the gate electrodes 71a and 71b.

The structure of this embodiment is effective especially when the size of an image display area becomes large. The reason is described below.

Since the EL display device of the present invention is driven by dividing one frame into a plurality of sub-frames, the load imposed on the driving circuit for driving a pixel portion is large. In order to decrease this, it is desirable to decrease the load (e.g., wiring line resistance, parasitic capacitance, or writing capacity of a TFT) of the pixel portion as much as possible.

Concerning the writing capacity of the TFT, a critical problem does not occur because a TFT with very high operational performance can be realized by the silicon film used in the present invention. Concerning the parasitic capacitance added to a data wiring line or a gate wiring line, most of it is formed between the wiring line and a cathode (or protective electrode) of an EL element formed on the wiring line. However, the parasitic capacitance is almost entirely negligible because an organic resin film with a low dielectric constant is formed to be 1.5-2.5 μm thick as a second interlayer insulating film.

From this fact, the most serious obstacle when applying the present invention to the EL display device whose pixel portion has a large area is the wiring line resistance of the data wiring line and the gate wiring line. It is possible, of course, to perform parallel processing by dividing the data signal side driving circuit into a plurality of sections, or to dispose the data signal side driving circuit and the gate signal side driving circuit, with a pixel portion therebetween, and send a signal from both sides, thus dropping the operational frequency of the driving circuit substantially. However, if so, there will occur another problem of increasing an area occupied by the driving circuit, for example.

Therefore, when performing the present invention, it is very effective to reduce the resistance of the gate wiring line as much as possible by the structure of this embodiment. The pixel structure of FIG. 17 in this embodiment is not at all to limit the present invention, and is merely a preferred example. This embodiment can be carried out by freely combining the structure of this embodiment and those of embodiments 1 to 3.

Embodiment 6

In the structure of FIG. 2 of embodiment 1, it is effective to use a high-cooling-effect material as the base film 12 disposed between the active layer and the substrate 11. Especially, the current controlling TFT has the problem of being liable to easily generate heat and undergo deterioration caused by self-heating because it passes a relatively large current for a long time. According to this embodiment, the base film has a cooling effect, and the TFT is prevented from undergoing thermal deterioration in that situation.

As a light transmissible material having the cooling effect, there is an insulating film that contains at least one element selected from the group consisting of B (boron), C (carbon), and N (nitrogen), and at least one element selected from the group consisting of Al (aluminum), Si (silicon), and P (phosphorus).

For example, use can be made of nitride of aluminum typified by aluminum nitride ($Al_xN_y$), carbide of silicon typified by silicon carbide ($Si_xC_y$), nitride of silicon typified by silicon nitride ($Si_xN_y$), nitride of boron typified by boron nitride ($B_xN_y$), and phosphide of boron typified by boron phosphide ($B_xP_y$). The oxide of aluminum typified by aluminum oxide ($Al_xO_y$) is superior in light transmission, and the thermal conductivity thereof is 20 $Wm^{-1}K^{-1}$. Thus, it is one of the desirable materials. In the light transmissible materials described above, x and y are arbitrary integers.

Other elements can be combined with the aforementioned compounds. For example, it is also possible to add nitrogen to aluminum oxide and use aluminum nitride oxide shown by $AlN_xO_y$. This material also has not only a cooling effect but also an effect of preventing the invasion of water or alkali metals. In the aluminum nitride oxide, x and y are arbitrary integers.

Additionally, it is possible to use the material described in Japanese Laid-open Patent Publication No. 90260 of 1987. In more detail, an insulating film that contains Si, Al, N, O, and M can be used wherein M is at least one kind of rare earth elements, preferably at least one element selected from the group consisting of Ce (cerium), Yb (ytterbium), Sm (samarium), Er (erbium), Y (yttrium), La (lantern), Gd (gadolinium), Dy (dysprosium), and Nd (neodymium). These materials also have not only a cooling effect but also an effect of preventing the invasion of water or alkali metals.

Additionally, use can be made of a carbon film that includes at least a diamond thin film or an amorphous carbon film (especially, a film close to the characteristic of diamond, called diamond-like carbon). These have a very high thermal conductivity, and are quite effective as heat radiation layers. However, these have a brown color and reduce transitivity as the film thickness increases, and therefore should be made as thin as possible (5-100 nm preferably).

A thin film made of the material having the cooling effect can be used as a single layer, but, instead, a lamination film can be used in which these thin films and an insulating film that contains silicon are stacked.

The structure of this embodiment can be freely combined with any one of the structures of embodiments 1 to 5.

Embodiment 7

In embodiment 1, it was said that, preferably, an organic EL material is used as an EL layer. However, the present invention can also be performed by using an inorganic EL material. In this case, since the inorganic EL material of the present time is of a very high driving voltage, TFTs to be used must have resisting-pressure characteristics resistible to such a driving voltage.

If an inorganic EL material of an even lower driving voltage is developed in the future, it will be applicable to the present invention.

The structure of this embodiment can be freely combined with any one of the structures of embodiments 1-6.

Embodiment 8

The active matrix type EL display device (EL module) formed by performing the present invention is superior to a liquid crystal display device in visibility in bright places because of its self-luminous properties. Therefore, the present invention can be used as a display portion of a direct-view type EL display (indicating a display equipped with an EL module). As the EL display, there are a personal computer monitor, a TV receiving monitor, an advertisement display monitor, and so on.

The present invention can be used as a display portion of all electronic equipment that includes displays as constituent parts, including the aforementioned EL display.

As the electronic equipment, there are an EL display, video camera, digital camera, head mounted type display, car-navigator, personal computer, personal digital assistant (mobile computer, portable telephone, electronic book, etc.), and picture reproducer provided with recording media (specifically, device capable of reproducing a recording medium, such as compact disk (CD), laser disc (LD), or digital video disc (DVD), and displaying the image). Examples of the electronic equipment are shown in FIG. 18.

Figure 18A:
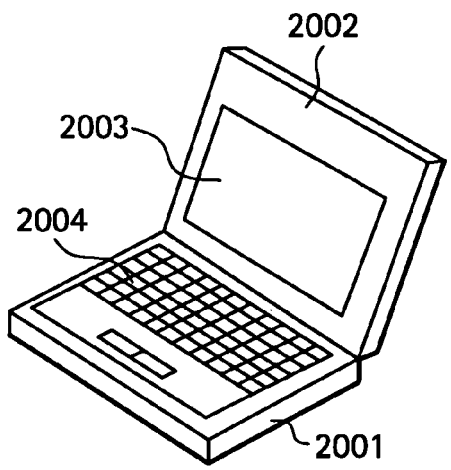
FIGS. 18A-18E show concrete examples of the electronic equipment.

FIG. 18(A) depicts a personal computer, which includes a main body 2001, case 2002, display portion 2003, and keyboard 2004. The present invention can be used as the display portion 2003.

Figure 18B:
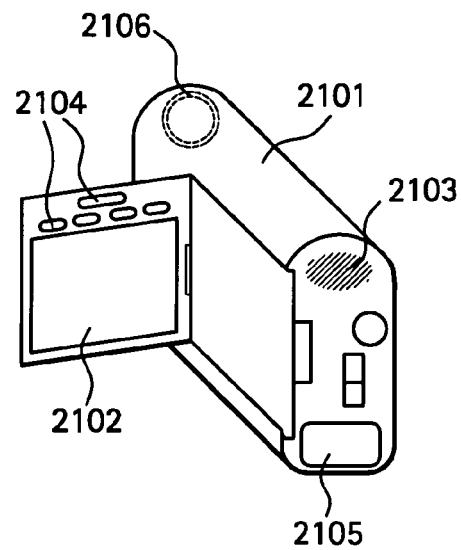

FIG. 18(B) depicts a video camera, which includes a main body 2101, display panel 2102, voice inputting portion 2103, operation switch 2104, battery 2105, and image reception portion 2106. The present invention can be used as the display panel 2102.

Figure 18C:
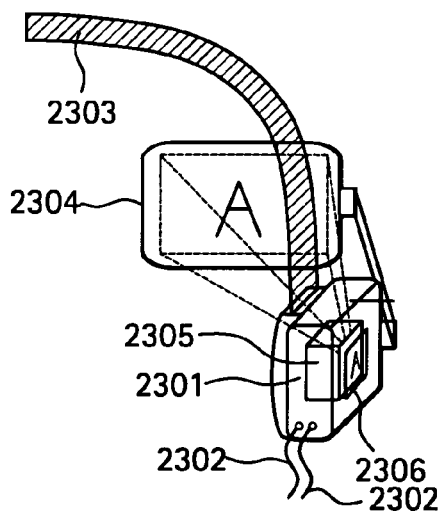

FIG. 18(C) depicts a part of a head mounted type EL display (right side), which includes a main body 2301, signal cable 2302, head fixation band 2303, display monitor 2304, optical system 2305, and display device 2306. The present invention can be used as the display device 2306.

Figure 18D:
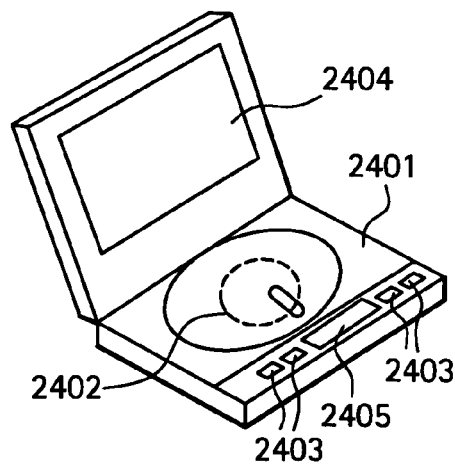

FIG. 18(D) depicts a picture reproducer (specifically, DVD player) provided with recording media, which includes a main body 2401, recording medium 2402 (CD, LD, DVD, etc.), operation switch 2403, display panel (a) 2404, and display panel (b) 2405. The display panel (a) chiefly displays image information, and the display panel (b) chiefly displays character information. The present invention can be used as the display panels (a) and (b). The present invention is applicable to a CD player or a game machine as a picture reproducer provided with recording media.

Figure 18E:
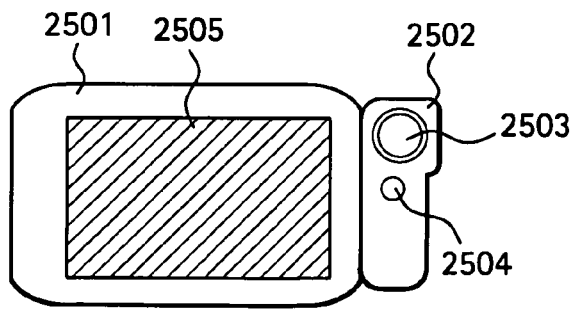

FIG. 18(E) depicts a portable (mobile) computer, which includes a main body 2501, camera 2502, image reception part 2503, operation switch 2504, and display portion 2505. The present invention can be used as the display portion 2505.

If the luminescence brightness of the EL material is enhanced in the future, the present invention will be applicable to a front or rear type projector.

The present invention has a quite wide scope of application, as mentioned above, and is applicable to electronic equipment in all fields. The electronic equipment of this embodiment can be realized by the structure resulting from the free combination of embodiments 1 to 7.

Embodiment 9

Figure 20A:
FIGS. 20A and 20B are a photographs substituted for a drawing, showing an example of display images of the EL display device of the present invention.
Figure 20B:

The photographs of FIGS. 20(A) and 20(B) relate to the EL display device of the present invention, and, more specifically, they show images displayed by the time-division gradation method of the present invention. That of FIG. 20(A) uses Alq$_3$ (tris-8-quinolinolato aluminum complex), which is a low molecular organic material, as a luminescent layer, and that of FIG. 20(B) uses PPV (polyparaphenylene-vinylene), which is a high molecular organic material, as a luminescent layer. The specification of the EL display devices of FIGS. 20(A) and 20(B) is shown in the following table.

TABLE 1

| Display size | 0.7 inches diagonally |
|---|---|
| Number of pixels | 640 × 480 |
| Pixel distance | 22.5 μm |
| Gradation | 64 (6 bit) |
| Aperture ratio | 38% |
| Operation clock frequency of source driving circuit | 12.5 MHz |
| Operation clock frequency of gate driving circuit | 232 kHz |
| Voltage of driving circuit | 9 V |
| Voltage of display region | 7 V |

TABLE 1-continued

| Duty ratio | 62.5% |
|---|---|
| Color | mono |

EFFECT OF THE INVENTION

According to the present invention, an active matrix type EL display device can be obtained that is capable of performing clear multi-gradation display without the influence of the characteristic variability of TFTs. In addition, a TFT having a very high operational performance is manufactured by forming an active layer with a silicon film used in the present invention, and time-division gradation display by digital signals of the active matrix type EL display device can be performed more effectively. In addition, a gradation failure caused by the characteristic variability of a current controlling TFT is removed by achieving such gradation display, and high-definition images excellent in color reproducibility can be obtained.

Further, the TFT itself formed on a substrate also realizes the active matrix type EL display device provided with high reliability by arranging the best structured TFTs in accordance with the performance required by circuits or elements.

Thus, high performance electronic equipment provided with high reliability and high image quality can be produced by mounting such an active matrix type EL display device as a display portion (display panel).

What is claimed is:

1. An EL display device comprising:
   a pixel portion formed over a substrate;
   plural pixels formed in the pixel portion;
   a switching TFT and a current-control TFT formed in one of the plural pixels;
   a first insulating film formed over the switching TFT and the current-control TFT;
   a pixel electrode electrically connected to the current-control TFT;
   a second insulating film formed over the first insulating film, wherein the second insulating film overlaps an edge of the pixel electrode;
   an EL layer formed over the pixel electrode, wherein the EL layer extends over at least an edge of the second insulating film;
   a transparent conductive film formed over the EL layer; and
   a passivation film formed over the transparent conductive film,
   wherein the edge of the pixel electrode is located over the first insulating film.

2. The EL display device according to claim 1, wherein the pixel electrode is a metal electrode.

3. The EL display device according to claim 1, wherein the pixel electrode is an aluminum alloy film.

4. The EL display device according to claim 1, wherein the transparent conductive film comprises indium tin oxide.

5. The EL display device according to claim 1, wherein the transparent conductive film is capable of functioning as an anode.

6. The EL display device according to claim 1 further comprising a second electrode formed between the pixel electrode and the EL layer.

7. The EL display device according to claim 1, wherein the passivation film is a silicon nitride oxide film or a silicon nitride film.

8. The EL display device according to claim 1, wherein the edge of the second insulating film has a tapered shape.

9. The EL display device according to claim 1, wherein the passivation film is in contact with the transparent conductive film.

10. An EL display device comprising:
a pixel portion formed over a substrate;
plural pixels formed in the pixel portion;
a switching TFT and a current-control TFT formed in one of the plural pixels;
a first passivation film formed over the switching TFT and the current-control TFT;
a first insulating film formed over the first passivation film;
a pixel electrode electrically connected to the current-control TFT;
a second insulating film formed over the first insulating film, wherein the second insulating film overlaps an edge of the pixel electrode;
an EL layer formed over the pixel electrode, wherein the EL layer extends over at least an edge of the second insulating film;
a transparent conductive film formed over the EL layer; and
a second passivation film formed over the transparent conductive film,
wherein the edge of the pixel electrode is located over the first insulating film.

11. The EL display device according to claim 10, wherein the pixel electrode is a metal electrode.

12. The EL display device according to claim 10, wherein the pixel electrode is an aluminum alloy film.

13. The EL display device according to claim 10, wherein the transparent conductive film comprises indium tin oxide.

14. The EL display device according to claim 10, wherein the transparent conductive film is capable of functioning as an anode.

15. The EL display device according to claim 10 further comprising a second electrode formed between the pixel electrode and the EL layer.

16. The EL display device according to claim 10, wherein the first passivation film is a silicon nitride oxide film or a silicon nitride film.

17. The EL display device according to claim 10, wherein the second passivation film is a silicon nitride oxide film or a silicon nitride film.

18. The EL display device according to claim 10, wherein the edge of the second insulating film has a tapered shape.

19. The EL display device according to claim 10, wherein the second passivation film is in contact with the transparent conductive film.

20. An electronic equipment having the display device according to claim 1.

21. An electronic equipment having the display device according to claim 10.

* * * * *

UNITED STATES PATENT AND TRADEMARK OFFICE
CERTIFICATE OF CORRECTION

| | | |
|---|---|---|
| PATENT NO. | : 7,821,200 B2 | |
| APPLICATION NO. | : 11/907860 | |
| DATED | : October 26, 2010 | |
| INVENTOR(S) | : Yukio Yamauchi et al. | |

It is certified that error appears in the above-identified patent and that said Letters Patent is hereby corrected as shown below:

At column 14, line 2, please change "EL layer 51 is former" to --EL layer 51 is formed--.

At column 26, line 25, please change "reduce transitivity" to --reduce transmittivity--.

Signed and Sealed this
Eleventh Day of January, 2011

David J. Kappos
*Director of the United States Patent and Trademark Office*